United States Patent
Vukkadala et al.

(10) Patent No.: US 11,966,156 B2
(45) Date of Patent: Apr. 23, 2024

(54) LITHOGRAPHY MASK REPAIR BY SIMULATION OF PHOTORESIST THICKNESS EVOLUTION

(71) Applicant: KLA Corporation, Milpitas, CA (US)

(72) Inventors: Pradeep Vukkadala, Santa Clara, CA (US); Guy Parsey, Ann Arbor, MI (US); Kunlun Bai, Campbell, CA (US); Xiaohan Li, Ann Arbor, MI (US); Anatoly Burov, Austin, TX (US); Cao Zhang, Ann Arbor, MI (US); John S. Graves, Austin, TX (US); John Biafore, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/231,413

(22) Filed: Aug. 8, 2023

(65) Prior Publication Data
US 2024/0061327 A1 Feb. 22, 2024

Related U.S. Application Data

(60) Provisional application No. 63/398,227, filed on Aug. 16, 2022.

(51) Int. Cl.
*G03F 1/70* (2012.01)
(52) U.S. Cl.
CPC ..................... *G03F 1/70* (2013.01)
(58) Field of Classification Search
USPC .......................................... 716/52
See application file for complete search history.

(56) References Cited

U.S. PATENT DOCUMENTS

| 8,916,831 | B2 * | 12/2014 | Wang | H01L 27/1462 250/372 |
| 10,474,042 | B2 * | 11/2019 | Biafore | G01N 21/8851 |
| 11,126,090 | B2 * | 9/2021 | Hansen | G06F 30/30 |
| 2014/0123084 | A1 * | 5/2014 | Tang | G03F 1/36 716/55 |
| 2017/0010538 | A1 | 1/2017 | Hansen et al. | |

(Continued)

OTHER PUBLICATIONS

Korean Intellectual Property Office, International Search Report and Written Opinion for International Application No. PCT/US2023/030026, dated Nov. 24, 2023, 8 pages.

(Continued)

*Primary Examiner* — Mohammed Alam
(74) *Attorney, Agent, or Firm* — Suiter Swantz IP

(57) ABSTRACT

A system for mask design repair may develop a simulation-based model of a layer thickness after one or more process steps for fabricating features on a sample, develop a transformed model of the fabrication process that emulates the simulation-based model and has a faster evaluation speed than the simulation-based model, and where the inputs to the transformed model include the input mask design, and where the outputs of the transformed model include one or more output parameters associated with fabrication of the input mask design as well as one or more sensitivity metrics describing sensitivities of the one or more output parameters to variations of the input mask design. The system may further receive a candidate mask design and generate a repaired mask design based on the transformed model and the candidate mask design.

31 Claims, 18 Drawing Sheets

(56) References Cited

U.S. PATENT DOCUMENTS

| | | |
|---|---|---|
| 2018/0095358 A1 | 4/2018 | Seitz et al. |
| 2020/0004161 A1 | 1/2020 | Yu et al. |
| 2020/0249578 A1 | 8/2020 | Hsu et al. |
| 2021/0263405 A1 | 8/2021 | Stanton et al. |
| 2021/0357566 A1* | 11/2021 | Simmons ............. G03F 7/705 |
| 2022/0129775 A1* | 4/2022 | Burov ............. G06N 7/01 |

OTHER PUBLICATIONS

Abrams et al., "Fast inverse lithography technology." Optical Microlithography XIX. vol. 6154. SPIE, 2006, 10 pages.

Baydin et al., "Automatic differentiation in machine learning: a survey." Journal of Marchine Learning Research 18 (Feb. 5, 2018), 43 pages.

Granik, "Fast pixel-based mask optimization for inverse lithography." Journal of Micro/Nanolithography, MEMS and MOEMS 5.4 (Oct.-Dec. 2006): 043002-043002, 13 pages.

Griewank, "Who invented the reverse mode of differentiation." Documenta Mathematica, Extra Volume ISMP 389400 (2012), 12 pages.

Latypov et al. "Gaussian random field EUV stochastic models, their generalizations and lithographically meaningful stochastic metrics." Extreme Ultraviolet (EUV) Lithography XII. vol. 11609. SPIE, 2021, 17 pages.

Mack et al., "Stochastic exposure kinetics of extreme ultraviolet photoresists: simulation study" Journal of Micro/Nanolithography, MEMS, and MOEMS 10.3 (Jul.-Sep. 2011): 033019-033019, 13 pages.

Mack et al., "Stochastic exposure kinetics of extreme ultraviolet photoresists: Trapping model." Journal of Vacuum Science & Technology B 31.6, Oct. 1, 2013, 8 pages.

Pang et al., "Source mask optimization (SMO) at full chip scale using inverse lithography technology (ILT) based on level set methods." Lithography Asia 2009. vol. 7520. SPIE, Dec. 2009, 18 pages.

Spence, "Full-chip lithography simulation and design analysis: how OPC is changing IC design." Emerging Lithographic Technologies IX. vol. 5751. SPIE, 2005, 15 pages.

TensorFlow Core, "Introduction to gradients and automatic differentiation," last updated May 12, 2023, https://www.tensorflow.org/guide/autodiff, 14 pages.

* cited by examiner

US 11,966,156 B2

LITHOGRAPHY MASK REPAIR BY SIMULATION OF PHOTORESIST THICKNESS EVOLUTION

CROSS-REFERENCE TO RELATED APPLICATION

The present application claims the benefit under 35 U.S.C. § 119(e) of U.S. Provisional Application Ser. No. 63/398,227, filed Aug. 16, 2022, entitled REPAIR OF LITHOGRAPHY MASK PRINTING DEFECTS DISCOVERED BY RAPID RIGOROUS SIMULATION OF PHOTORESIST THICKNESS EVOLUTION, which is incorporated herein by reference in the entirety.

TECHNICAL FIELD

The present disclosure relates generally to lithography mask design and, more particularly to, repairing lithography mask designs to mitigate stochastic defects.

BACKGROUND

Demands for reducing the feature sizes in semiconductor devices result in stricter tolerances for lithographic printing processes. While the minimum feature size may generally be reduced by scaling down the wavelength of light used in a lithographic process, it is often desirable to fabricate features near or below the classical resolution limits at a particular wavelength. In this regime, stochastic defects associated with randomness of various processes become increasingly problematic. Stochastic defects that occur during semiconductor fabrication may be attributed to the inherent stochasticity of a multitude of physical phenomenon that constitute the lithography pattern transfer process such as, but not limited to, photon exposure and absorption, photo-product diffusion, chemical-reactant spatial distribution, chemical reaction, or the like. Notably, stochasticity is different than uncertainty and relates to the random variations within a process. Typical approaches for characterizing stochastic wafer defects include top-down scanning electron microscope (SEM) based inspection, top-down simulation of after-development inspection (ADI) and/or after-etch inspection (AEI) pattern edge placement and inspection thereof. However, such techniques may be overly time consuming and/or may fail to provide an adequate measure of the parameters that result in defectivity of a fabricated sample, which may be of ultimate interest. There is therefore a need to develop systems and methods to address such deficiencies.

SUMMARY

A system is disclosed in accordance with one or more illustrative embodiments. In one illustrative embodiment, the system includes a controller including one or more processors. In another illustrative embodiment, the controller develops a simulation-based model of a layer thickness after one or more process steps for fabricating features on a sample, where the simulation-based model accepts an input mask design to be exposed on the sample and provides at least the layer thickness after the one or more process steps as an output. In another illustrative embodiment, the controller develops a transformed model of the fabrication process that emulates the simulation-based model and has a faster evaluation speed than the simulation-based model for a selected range of at least one of inputs or outputs, where the inputs to the transformed model include the input mask design, and where the outputs of the transformed model include one or more output parameters associated with fabrication of the input mask design as well as one or more sensitivity metrics describing sensitivities of the one or more output parameters to variations of the input mask design. In another illustrative embodiment, the one or more output parameters include at least one of the layer thickness after the one or more process steps or a stochastic defect rate based on the layer thickness. In another illustrative embodiment, the controller receives a candidate mask design. In another illustrative embodiment, the controller generates a repaired mask design based on the transformed model and the candidate mask design.

A method is disclosed in accordance with one or more illustrative embodiments. In one illustrative embodiment, the method includes developing a simulation-based model of a layer thickness after one or more process steps for fabricating features on a sample, where the simulation-based model accepts an input mask design to be exposed on the sample and provides at least the layer thickness after the one or more process steps as an output. In another illustrative embodiment, the method includes developing a transformed model of the fabrication process that emulates the simulation-based model and has a faster evaluation speed than the simulation-based model for a selected range of at least one of inputs or outputs, where the inputs to the transformed model include the input mask design, and where the outputs of the transformed model include one or more output parameters associated with fabrication of the input mask design as well as one or more sensitivity metrics describing sensitivities of the one or more output parameters to variations of the input mask design. In another illustrative embodiment, the one or more output parameters include at least one of the layer thickness after the one or more process steps or a stochastic defect rate based on the layer thickness. In another illustrative embodiment, the method includes receiving a candidate mask design. In another illustrative embodiment, the method includes generating a repaired mask design based on the transformed model and the candidate mask design.

A system is disclosed in accordance with one or more illustrative embodiments. In one illustrative embodiment, the system includes a controller including one or more processors. In another illustrative embodiment, the controller develops a simulation-based model of a layer thickness after one or more process steps for fabricating features on a sample, where inputs to the simulation-based model include a recipe defining an input mask design to be exposed on the sample and one or more process parameters associated with the one or more process steps, and where outputs of the simulation-based model include at least the layer thickness after the one or more process steps. In another illustrative embodiment, the controller develops a transformed model of the fabrication process that emulates the simulation-based model and has a faster evaluation speed than the simulation-based model for a selected range of at least one of inputs or outputs, where the inputs to the transformed model include the input mask design and at least one of the one or more process parameters, and where the outputs of the transformed model include one or more output parameters associated with fabrication of the input mask design with the one or more process steps as well as one or more sensitivity metrics describing sensitivities of the one or more output parameters to the inputs to the transformed model. In another illustrative embodiment, the one or more output parameters include at least one of the layer thickness after the one or more process steps or a stochastic defect rate based on the layer thickness. In another illustrative embodiment, the controller receives a candidate recipe including a candidate mask design and the at least one of the one or more process parameters. In another illustrative embodiment, the controller generates a repaired recipe based on the transformed model and the candidate mask design.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
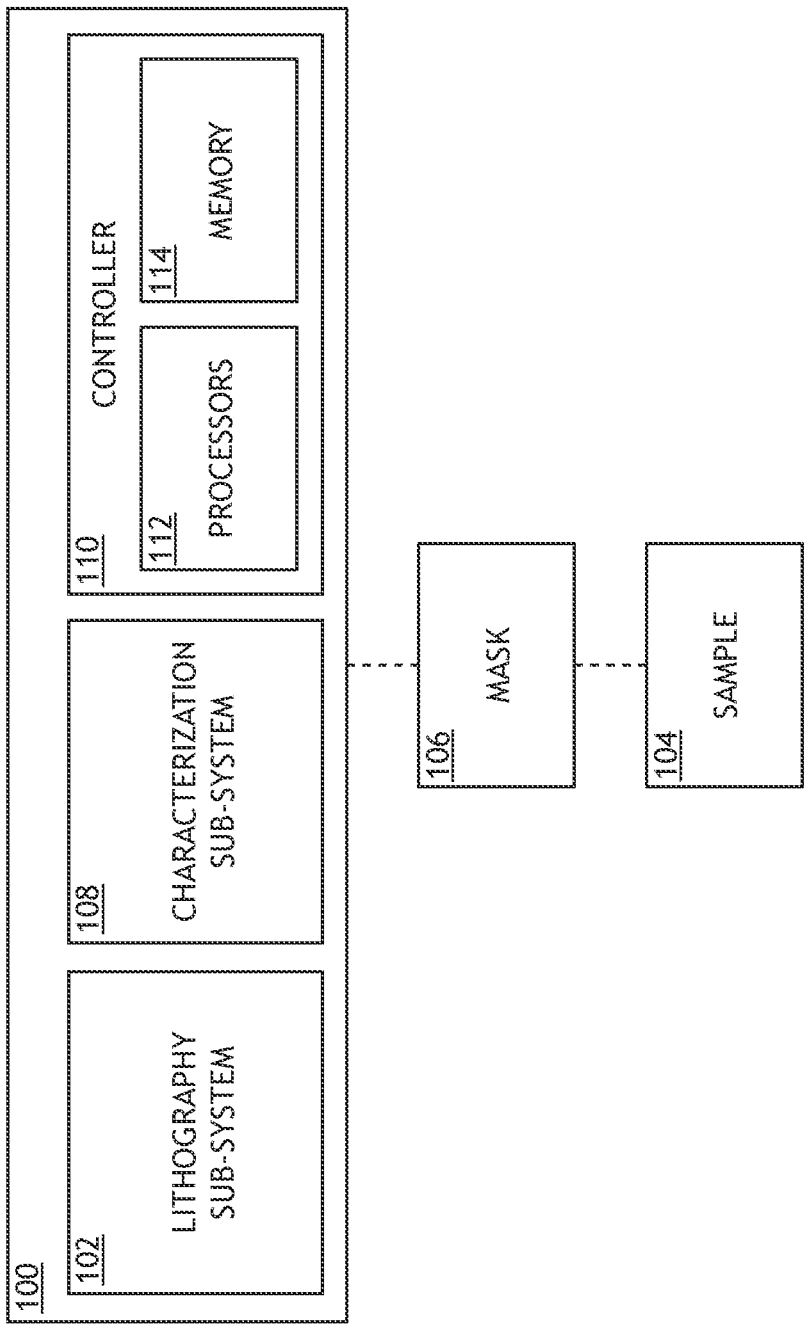
FIG. 1A is a block diagram of a system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods providing reparative mask pattern design changes that seek to mitigate or control stochastic wafer defects within acceptable tolerances. For example, embodiments of the present disclosure may evaluate an input mask design for sensitivity to stochastic defects and provide reparative changes to the input mask design to reduce the sensitivity to such stochastic defects. Notably, the systems and methods disclosed herein may provide reparative changes to masks that have already undergone other modifications such as, but not limited to, optical proximity correction (OPC) variations to promote accurate fabrication in accordance with the intended design. It is noted that OPC and other techniques may be prone to errors when based on "rule-based" or otherwise "compact" modeling techniques that may include approximations to provide full-chip evaluation with a high throughput. However, the systems and methods disclosed herein may incorporate more accurate and potentially more computationally rigorous modeling to provide superior mitigation of stochastic defects, but may also provide acceptable throughput. Further, the repair process may be flexibly applied either to a full design (e.g., full chip) or in a targeted manner to certain regions of interest and/or regions that are most susceptible to stochastic defects of interest.

Techniques for measuring and controlling semiconductor fabrication in the presence of stochastic defects is generally described in U.S. Pat. No. 10,474,042 issued on Nov. 12, 2019, which is incorporated herein by reference in its entirety. Stochastic defects may be attributed to an inherent stochasticity of a multitude of physical phenomenon that constitute the lithography pattern transfer process such as, but not limited to, photon exposure and absorption, photoproduct diffusion, chemical-reactant spatial distribution, or chemical reaction. In this way, Stochastically-occurring fabrication defects may occur with a certain probability when nominally identical structures are fabricated under nominally identical conditions such as, but not limited to, at multiple locations within a field, at a given location across multiple fields on a single wafer, or at a given location on a sample across multiple wafers.

In some embodiments, a rigorous simulation-based model (e.g., a physics-based model) is first generated that predicts a sample layer thickness after one or more process steps (e.g., lithography, etching, polishing, or the like), which may enable an accurate understanding of stochastic defectivity. For example, the simulation-based model may predict a thickness of a photoresist layer after lithographic exposure (e.g., after a development step). As another example, the simulation-based model may predict a thickness of a process layer after an etching and/or polishing step. Further, the simulation-based model may incorporate the effects of stochastic variations and/or variations of process parameters that may naturally occur during processing such as, but not limited to, dose, focus position, illumination numerical aperture, illumination source shape, post-exposure bake temperature, development time, or the like.

Subsequently, a transformed model may be developed that reproduces the results of the simulation-based model for a selected input and/or output space while providing faster evaluation speed (e.g., faster computation times) than the simulation-based model. For example, the transformed model may emulate the simulation-based model for a selected range of inputs (e.g., a certain range of inputs such as, but not limited to, mask designs and/or fabrication process parameters) and/or outputs (e.g., certain range of outputs such as, but not limited to, corrections to the mask designs, a relatively lower pixel density associated with corrections to the mask designs, and/or process parameters) within acceptable tolerances while providing faster evaluation speed (e.g., faster computation times) than the simulation-based model. The transformed model may be, but is not required to be, a machine-learning model. In a general sense, the transformed model may be tuned to balance input space coverage, speed, and accuracy for a given application. The transformed model may further provide mathematical differentiability such that the transformed model may provide direct and efficient estimates of the sensitivity of a particular mask design (or variations thereof) to output parameters of interest such as, but not limited to, stochastic defect rates. Such sensitivity estimates may be provided in the form of sensitivity metrics (e.g., analytical model gradients, or the like) and may be used to provide reparative design changes to improve the performance of the mask.

A transformed model and the associated sensitivity metrics may be utilized in various ways within the spirit and scope of the present disclosure to provide reparative mask design changes that mitigate stochastic defects.

In some embodiments, the transformed model evaluates a candidate mask design and provides outputs in the form of output parameters of interest (e.g., stochastic defect rate, resist edge placement error, distance-field violations, mask rule check violations, or the like), as well as sensitivity metrics characterizing the sensitivity of the candidate mask design to the output parameters. In the case of multiple output parameters, the sensitivity metrics may provide a measure of the sensitivity of the candidate mask design to the output parameters individually or in combination. If the output parameters are not acceptable (e.g., outside of selected tolerances), the candidate mask design is updated based on the sensitivity metrics. This process may be iterated as necessary to provide a repaired mask design that meets the selected tolerances. It is noted that mask designs may be provided in various forms within the spirit and scope of the present disclosure such as, but not limited to, binary representation, polygon representation, distance-field representation, or level-set representation. In a general sense, the mask design may be represented through any parameters for which sensitivity metrics can be generated using the transformed model.

In some embodiments, the transformed model is used to provide training data for a machine learning model for mask repair. For example, a machine learning model may be developed to generate a repaired mask design from an input mask design, where the machine learning model is trained at least in part based on training data generated by the transformed model. As an illustration, the transformed model may evaluate a repaired mask design by generating output parameters and associated sensitivity metrics. Further, the sensitivity metrics from the transformed model may be used to train the machine learning model (e.g., the weights within the machine learning model) in cases where the repaired mask design provided by the machine learning model does not meet application tolerances.

Additional embodiments of the present disclosure are directed to providing corrective modifications to additional aspects of a fabrication recipe such as, but not limited to, properties of illumination used during lithography (e.g., a source distribution, a wavelength, a polarization, an incidence angle, or the like) or properties of the sample (e.g., a thickness of a process layer, a thickness of a photoresist, or the like). In this way, such recipe parameters may be adjusted in addition to and/or instead of the mask design to reduce a probability of stochastic defects during fabrication.

Referring now to FIGS. 1A-10, systems and methods providing reparative mask design changes to mitigate stochastic defects are described in greater detail, in accordance with one or more embodiments of the present disclosure.

FIG. 1A is a block diagram of a system 100, in accordance with one or more embodiments of the present disclosure. In some embodiments, the system 100 includes a lithography sub-system 102 for lithographically printing one or more patterns on a sample 104 based on a mask 106 (e.g., a lithography mask, a pattern mask, a reticle, or the like). For example, the lithography sub-system 102 may operate by illuminating the mask 106 and projecting an image of the mask 106 onto the sample 104.

The lithography sub-system 102 may include any type of lithographic printing tool known in the art including, but not limited to, a scanner or a stepper. Further, the lithography sub-system 102 may utilize any type of illumination. For example, the lithography sub-system 102 may utilize extreme ultraviolet (EUV) illumination and thus be characterized as an EUV lithography sub-system.

In some embodiments, the system 100 includes a characterization sub-system 108 configured to generate one or more measurements of a mask 106 and/or a sample 104 with features associated with a mask 106 via lithographic exposure and potentially additional processing steps. The characterization sub-system 108 may include any type of characterization tool known in the art such as, but not limited to, an optical characterization tool (e.g., an optical imaging tool, or the like), an x-ray characterization tool, or particle-beam characterization tool (e.g., a scanning electron microscope (SEM), a transmission electron microscope (TEM), a focused ion beam (FIB) tool, or the like). Further, the characterization sub-system 108 or any portions thereof may be characterized as an inspection tool and/or a metrology. In this way, the characterization sub-system 108 may perform various functions including, but not limited to, identifying defects in a mask 106 or performing one or more measurements of portions of the mask (e.g., critical dimension (CD) measurements, feature thickness measurements, film thickness measurements, composition measurements, edge position measurements, or the like).

In some embodiments, the system 100 includes a controller 110. In some embodiments, the controller 110 includes one or more processors 112 configured to execute program instructions maintained in memory 114 (e.g., a memory device). The controller 110 may be communicatively coupled with any components of the system 100 to provide unidirectional communication and/or bidirectional communication. In this way, controller 110 may execute (e.g., via the one or more processors 112) any of the various process steps described throughout the present disclosure such as, but not limited to, develop a simulation-based model of a fabrication process, develop a transformed model that emulates the simulation-based model for a selected input space and provides sensitivity metrices describing sensitivities of one or more output parameters to variations of a mask, receive a candidate mask design, or generate a repaired mask design based on iteratively updating the candidate mask design using the transformed model.

The one or more processors 112 of a controller 110 may include any processing element known in the art. In this sense, the one or more processors 112 may include any microprocessor-type device configured to execute algorithms and/or instructions. In some embodiments, the one or more processors 112 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory 114. Further, the steps described throughout the present disclosure may be carried out by a single controller 110 or, alternatively, multiple controllers. Additionally, the controller 110 may include one or more controllers housed in a common housing or within multiple housings. In this way, any controller or combination of controllers may be separately packaged as a module suitable for integration into system 100.

The memory 114 may include any storage medium known in the art suitable for storing program instructions executable by the associated one or more processors 112. For example, the memory 114 may include a non-transitory memory medium. By way of another example, the memory 114 may include, but is not limited to, a read-only memory, a random access memory, a magnetic or optical memory device (e.g., disk), a magnetic tape, a solid state drive and the like. It is further noted that memory 114 may be housed in a common controller housing with the one or more processors 112. In some embodiments, the memory 114 may be located remotely with respect to the physical location of the one or more processors 112 and controller 110. For instance, the one or more processors 112 of the controller 110 may access a remote memory (e.g., server), accessible through a network (e.g., internet, intranet and the like). Therefore, the above description should not be interpreted as a limitation on the present invention but merely an illustration.

Mask design repair is described in greater detail in FIGS. 2-10. Typical approaches to stochastic defect control focus on modeling the placement of edges in a photoresist (e.g., a resist) or some intermediate metric such as an aerial image (e.g., either continuous or thresholded and typically contoured to approximate resist edges). The edges in such techniques are typically defined as the boundary separating a resist region from a space region, where defects are typically defined to be locations where edges either intersect or show a tendency to intersect. For example, typical approaches to stochastic defect control are generally described in U.S. Pat. No. 11,126,090 entitled "Model for calculating a stochastic variation in an arbitrary pattern" and issued on Sep. 21, 2021; Spence, Chris. "Full-chip lithography simulation and design analysis: how OPC is changing IC design." Emerging Lithographic Technologies IX. Vol. 5751. SPIE, 2005; Granik, Yuri. "Fast pixel-based mask optimization for inverse lithography." Journal of Micro/Nanolithography, MEMS and MOEMS 5.4 (2006): 043002-043002; Abrams, Daniel S., and Pang, Linyong, "Fast inverse lithography technology." Optical Microlithography XIX. Vol. 6154. SPIE, 2006; Pang, Linyong, et al. "Source mask optimization (SMO) at full chip scale using inverse lithography technology (ILT) based on level set methods." Lithography Asia 2009. Vol. 7520. SPIE, 2009; and Latypov, Azat, et al. "Gaussian random field EUV stochastic models, their generalizations and lithographically meaningful stochastic metrics." Extreme Ultraviolet (EUV) Lithography XII. Vol. 11609. SPIE, 2021; all of which are incorporated herein by reference in their entireties.

However, it is contemplated herein that stochastic defectivity may be more directly and accurately estimated based on the local resist thickness at regions of interest on a sample (e.g., a wafer) rather than through the edge positions. This is in part because edge position by definition encodes an approximate form of resist thickness. Further, existing techniques may be unsuitable for relatively rare stochastic errors. Advantages of stochastic defect characterization based on local resist thickness are generally described in U.S. Patent Publication No. 2022/0129775 entitled "Prediction and metrology of stochastic photoresist thickness defects" and published on Apr. 28, 2022; Mack, Chris A., et al. "Stochastic exposure kinetics of extreme ultraviolet photoresists: simulation study." Journal of Micro/Nanolithography, MEMS, and MOEMS 10.3 (2011): 033019-033019; and Mack, Chris A., John J. Biafore, and Mark D. Smith. "Stochastic exposure kinetics of extreme ultraviolet photoresists: Trapping model." Journal of Vacuum Science & Technology B 31.6 (2013); all of which are incorporated herein by reference in their entireties.

Figure 2B:
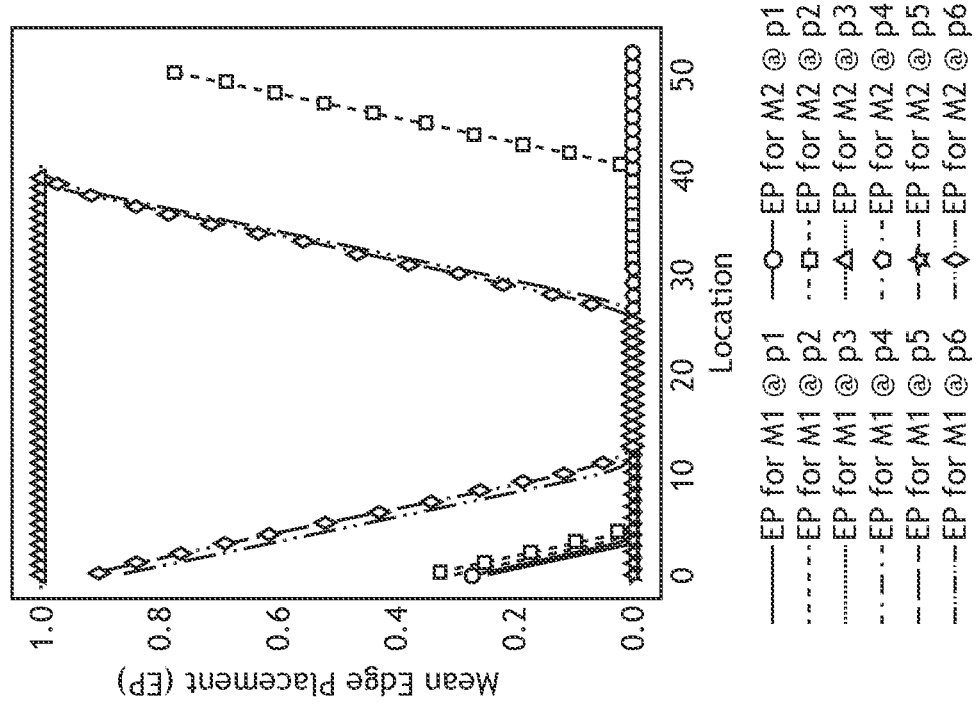
FIG. 2B is a plot of mean resist edge position for six slices of both mask designs of FIG. 2A, in accordance with one or more embodiments of the present disclosure.
Figure 2A:
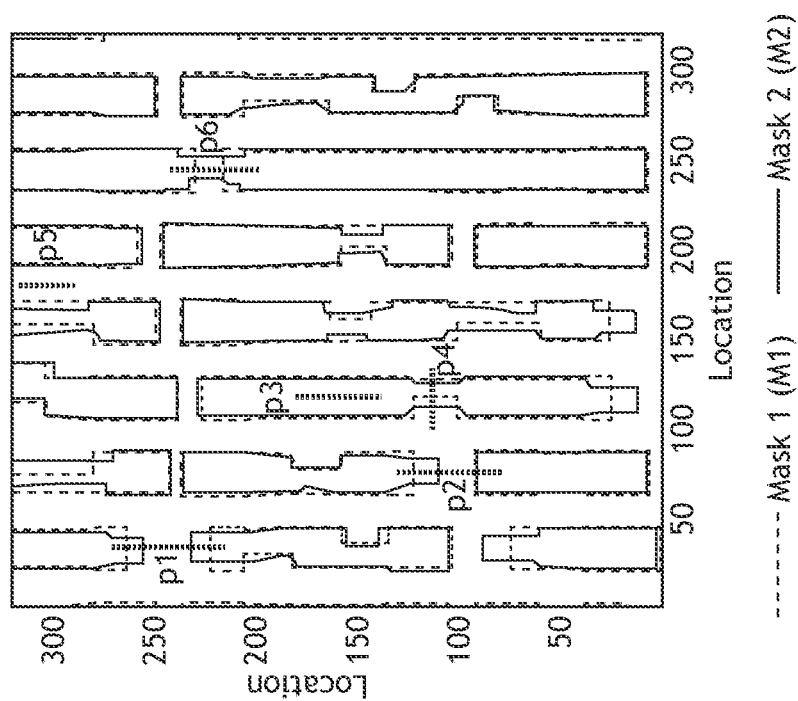
FIG. 2A is a top view of two mask designs, in accordance with one or more embodiments of the present disclosure.
Figure 2D:
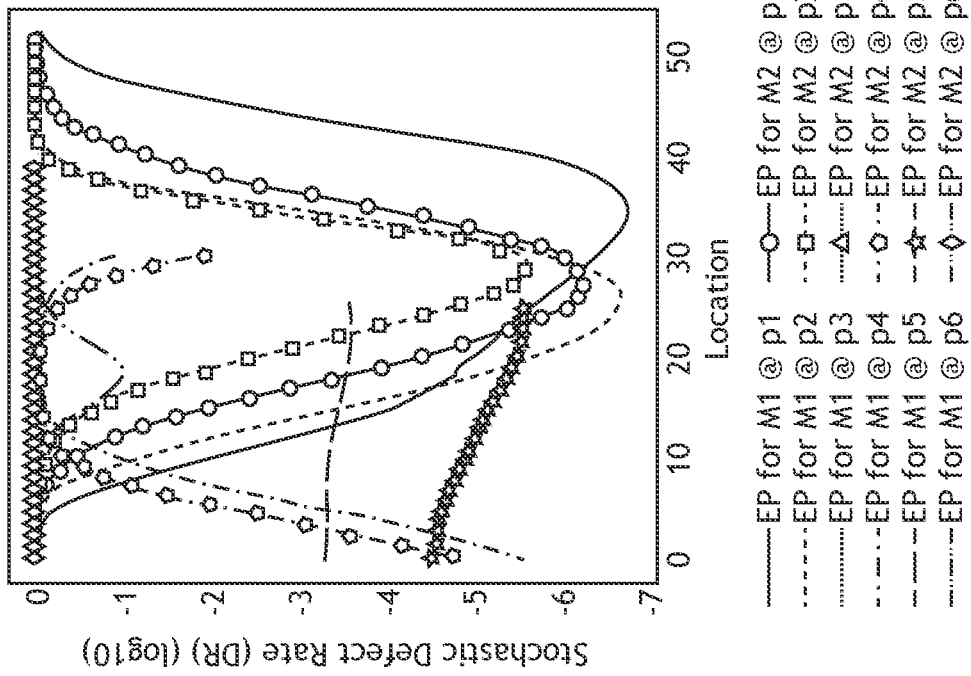
FIG. 2D is a plot of stochastic defect rate for the six slices of the mask designs of FIG. 2A, in accordance with one or more embodiments of the present disclosure.
Figure 2C:
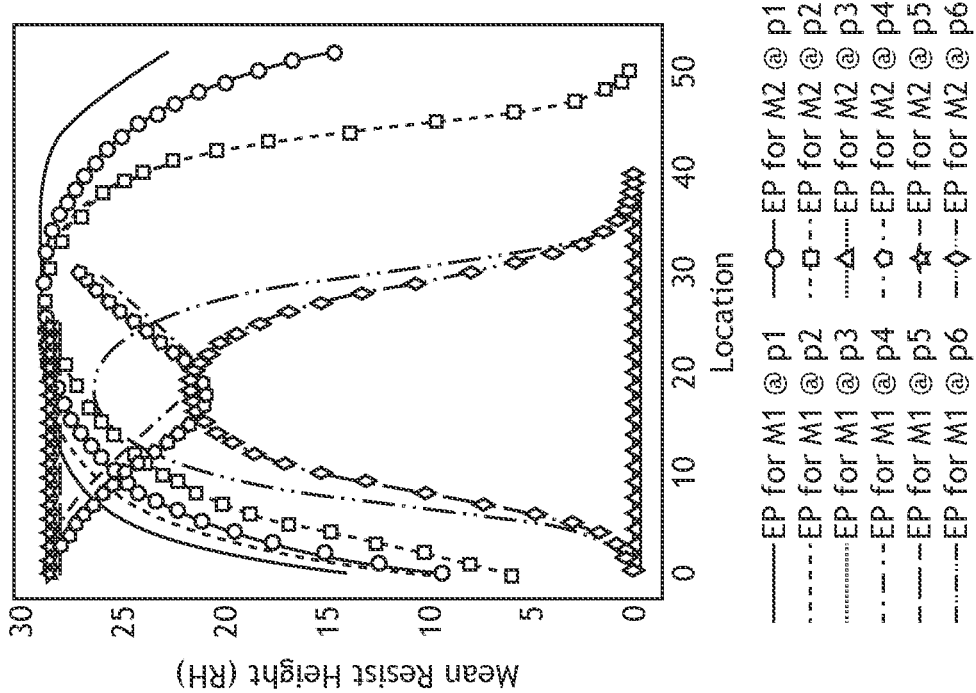
FIG. 2C is a plot of mean resist height for the six slices of the mask designs of FIG. 2A, in accordance with one or more embodiments of the present disclosure.

As an illustration, FIGS. 2A-2D depict a series of plots that demonstrate stochastic defect rates for two mask designs that provide similar edge positions, but different local resist thicknesses and different error rates, in accordance with one or more embodiments of the present disclosure. FIG. 2A is a top view of two mask designs (labeled "Mask 1" and "Mask 2"), in accordance with one or more embodiments of the present disclosure. FIG. 2B is a plot of mean resist edge position (EP) for six slices (p1-p6) of both mask designs of FIG. 2A, in accordance with one or more embodiments of the present disclosure. FIG. 2C is a plot of mean resist height (RH) for the six slices of the mask designs of FIG. 2A, in accordance with one or more embodiments of the present disclosure. FIG. 2D is a plot of stochastic defect rate (DR) for the six slices of the mask designs of FIG. 2A, in accordance with one or more embodiments of the present disclosure.

As illustrated by FIGS. 2A-2D, both mask designs provide substantially the same edge positions when fabricated on a sample 104 (e.g., see FIGS. 2A and 2B). However, the mask designs show substantive deviations of both the mean resist height and stochastic defect rate in certain locations. For example, both the mean resist height data (e.g., see FIG. 2C) and the stochastic defect rates (e.g., see FIG. 2D) for the two mask designs exhibit substantial deviations for slices p1, p4, and p6. In this way, resist height is a more accurate predictor of stochastic defect rate than the resist edge position.

Figure 3A:
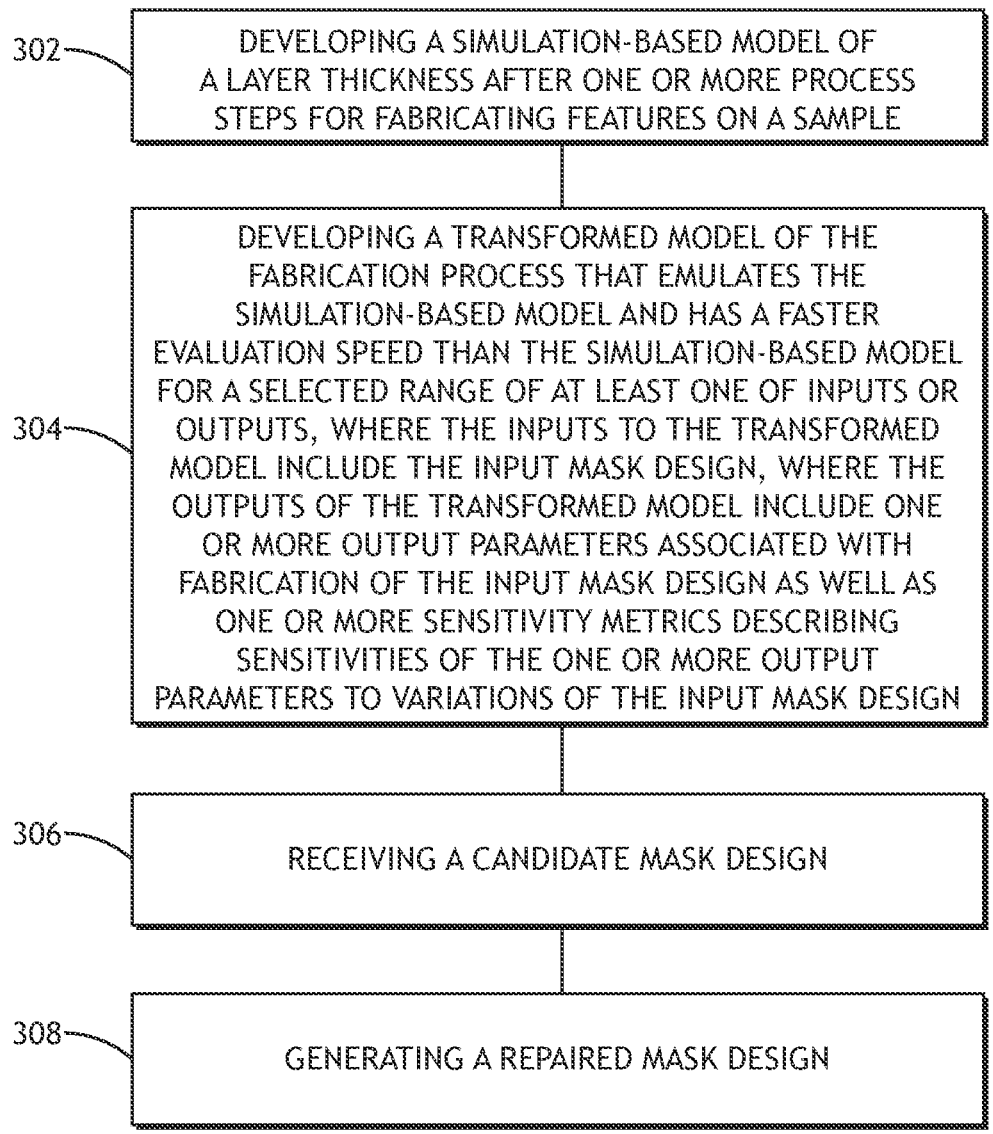
FIG. 3A is a flow diagram illustrating steps performed in a method for mask repair, in accordance with one or more embodiments of the present disclosure.

FIG. 3A is a flow diagram illustrating steps performed in a method 300 for mask repair, in accordance with one or more embodiments of the present disclosure. Applicant notes that the embodiments and enabling technologies described previously herein in the context of the system 100 should be interpreted to extend to the method 300. For example, the one or more processors 112 of the system 100 may execute program instructions causing the one or more processors 112 to implement any of the various steps of the method 300. It is further noted, however, that the method 300 is not limited to the architecture of the system 100.

In some embodiments, the method 300 includes a step 302 of developing a simulation-based model of sample layer thickness after one or more process steps for fabricating features on a sample 104. As an illustration, the simulation-based model may provide a distribution of the sample layer thickness as a function of position across the sample 104 or a portion thereof. The distribution of sample layer thickness may be expressed either as a single output value per position on the sample 104 or a probability distribution of thickness per position on the sample 104.

The step 302 may describe features on a sample 104 after any number of process steps. For example, features on a sample 104 (e.g., on a particular layer of the sample 104) may be fabricated using process steps such as, but not limited to, deposition of one or more layers (e.g., process layers and/or photoresist layers), lithographic exposure of a pattern from a mask 106, post-exposure bake, etching, ion implantation (e.g., doping), metallization oxidation, polishing, or the like. Further, such steps may be repeated multiple times to build up a semiconductor device. In some embodiments, the simulation-based model of step 302 provides photoresist thickness after a lithographic exposure process, which may be analogous to what may be measured at an after-development inspection (ADI) step. The simulation-based model may model any type of commercial or custom photoresist including, but not limited to, Positive-Tone-Develop Chemically-Amplified-Resist (PTD CAR), a Negative-Tone-Develop (NTD) resist, or a Metal-Oxide (MOx) resist. In some embodiments, the simulation-based model of step 302 provides process layer thickness after an etching step, which may be analogous to what may be measured at an after-etch inspection (AEI) step. Further, the simulation-based model of step 302 may provide various additional outputs such as, but not limited to, edge placement, line edge roughness (LER), or critical dimension uniformity (CDU) after any process step.

The step 302 may include developing a simulation-based model of sample layer thickness using any suitable technique. Input parameters to the simulation-based model may include, but are not limited to, a design of the mask 106, properties of the sample 104 (e.g., composition, thickness, or the like), and/or process parameters. For example, process parameters may include, but are not limited to, properties of illumination during lithography (e.g., intensity, spectrum, polarization, numerical aperture, incidence angle, source shape, total dose or the like), focus position, development time, post-exposure back temperature, or the like. As used herein, an input space defines ranges of the various input parameters that may be utilized by the model.

In some embodiments, the simulation-based model includes modeling of optical interaction of light with the sample 104 during a lithographic exposure of a mask 106 utilizing techniques such as, but not limited to, rigorous coupled wave analysis (RCWA), finite difference time-domain (FDTD) analysis, finite element method (FEM) analysis, method of moments analysis, surface integral techniques, or volume integral techniques. In this way, the simulation-based model may be characterized as a physics-based model. In some embodiments, photoresist thickness may be simulated using a simulator such as, but not limited to, PROLITH (Positive Resist Optical Lithography), which is a physics-based simulator sold by KLA Corporation. Physics-based simulation of photoresist thickness is generally described in U.S. Patent Publication Number 2022/0129775 entitled "Prediction and metrology of stochastic photoresist thickness defects" and published on Apr. 28, 2022 referenced above and incorporated herein by reference in its entirety.

It is contemplated herein that the simulation-based model developed in step 302 may be suitable for characterizing stochastic defects during a fabrication process. For example, a Monte Carlo technique may be utilized to apply the simulation-based model many times to randomly sample a stochastic process (e.g., photon absorption or the like). In this case, the outputs of the simulations may provide a probability distribution of an output parameter (e.g., local photoresist thickness). Such a technique may theoretically provide an accurate characterization of a wide range of process steps over a wide range of conditions. Further, the simulation-based model may incorporate or otherwise account for variations of the process parameters (e.g., process variations) that may naturally occur during fabrication. For example, the simulation-based model may provide probabilities of any output parameters (e.g., sample layer thickness, or the like) based on known or expected variations of the process parameters and/or stochastic processes.

However, it is further contemplated herein that such a technique may require a vast number of samples to adequately characterize relatively rare stochastic defects (e.g., defects with parts-per-million or parts-per-billion defect rates). Further, the execution time of such a model may be relatively slow. As a result, reliance on such a simulation-based model alone to characterize stochastic defect rates may be undesirable or impractical.

In some embodiments, the method 300 includes a step 304 of developing a transformed model of the fabrication process that emulates the simulation-based model and has a faster evaluation speed than the simulation-based model for a selected range of inputs and/or or outputs. The transformed model may accept an input mask design, input parameters within at least a portion of the input space of the simulation-based model (e.g., as fixed or floating parameters), outputs one or more output parameters associated with fabrication of the input mask design, and outputs one or more sensitivity metrics describing sensitivities of the one or more output parameters to variations of the input mask design. The output parameters provided by the transformed model may include, but are not limited to, sample layer thickness (e.g., photoresist and/or process layer thickness) or a stochastic defect rate based on the sample layer thickness. Further, the transformed model may incorporate or otherwise account for variations of the process parameters (e.g., process variations) that may naturally occur during fabrication. For example, the transformed model may provide probabilities of any output parameters (e.g., sample layer thickness, or the like) based on known or expected variations of the process parameters and/or stochastic processes. In this way, the transformed model may be suitable for characterizing a robustness of a mask design to process variations.

The step 304 may include developing a transformed model of at least sample layer thickness using any suitable technique. In some embodiments, the transformed model is generated using machine learning techniques. In this way, the transformed model may be a trained machine learning model. Such a machine learning model may be trained using any suitable training data. For example, such a machine learning model may be trained using simulation data and/or metrology data from training samples fabricated with different variations of the input parameters. The metrology data may be generated using any suitable characterization subsystem 108 such as, but not limited to, a scanning electron microscopy (SEM) tool, a transmission electron microscopy tool (TEM), an x-ray tool, or the like. Further, such a machine learning model may incorporate any type of supervised machine learning model such as, but not limited to, a general linear model, a neural network, a Bayesian inference model, a Bayesian neural network, a deep neural network, a convolutional neural network, or a support vector machine. In some embodiments, the machine learning further incorporates other techniques such as, but not limited to, unsupervised learning, semi-supervised learning, or reinforcement learning.

In some embodiments, the transformed model is designed to provide faster evaluation speeds than the simulation-based model for at least a subset of the input space and/or output space of the simulation-based model. In this way, development and utilization of the transformed model may provide increased throughput relative to the simulation-based model while maintaining performance tolerances for at least the subset of the input space. In a general sense, the transformed model may be tunable to provide a desired tradeoff between accuracy, speed (e.g., evaluation speed), and the size of the input space (e.g., sizes of input parameter ranges for which the transformed model emulates the simulation-based model within acceptable tolerances). The use of a machine learning model for photoresist thickness that emulates a simulation-based model is generally described in U.S. Patent Publication Number 2022/0129775 entitled "Prediction and metrology of stochastic photoresist thickness defects" and published on Apr. 28, 2022, which is referenced above and incorporated herein by reference in its entirety.

Figure 4:
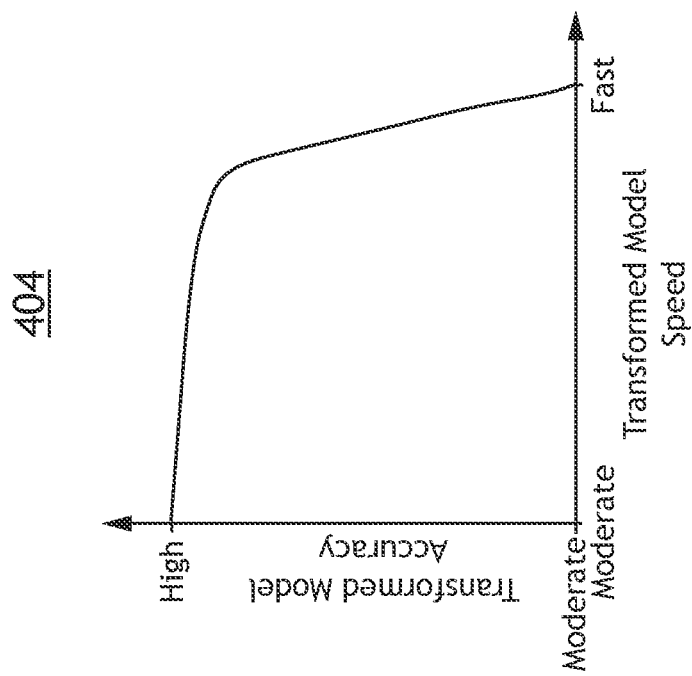
FIG. 4 is a conceptual illustration of tradeoffs of the transformed model, in accordance with one or more embodiments of the present disclosure.
Figure 4:
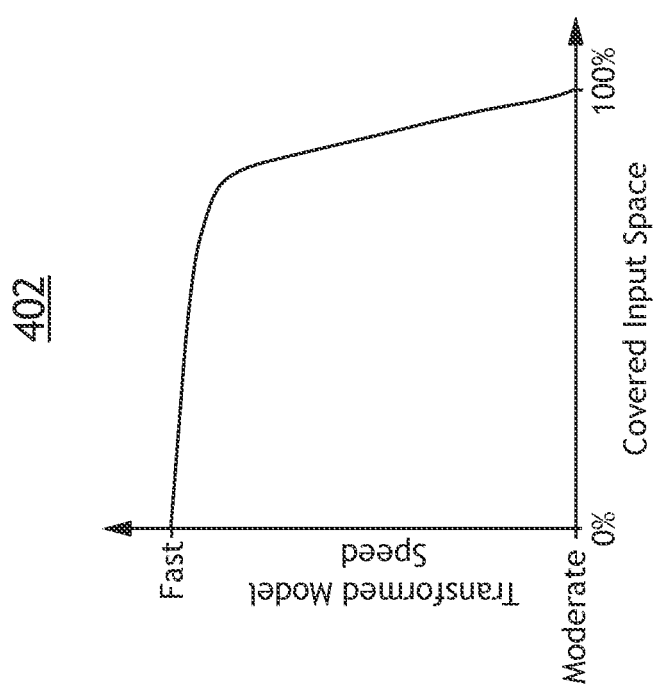

FIG. 4 is a conceptual illustration of tradeoffs of the transformed model, in accordance with one or more embodiments of the present disclosure. Plot 402 is a conceptual illustration of the speed of the transformed model as a function of the covered input space of the simulation-based model. Plot 404 is a conceptual illustration of the accuracy of the transformed model as a function of the speed of the transformed model. As illustrated, the speed of the transformed model may generally decrease as the covered input space increases. Further, the accuracy of the transformed model may generally decrease as the speed increases. However, there may be conditions for which the transformed the transformed model provides sufficient accuracy (e.g., within selected tolerances) over a suitable subset of the input space of the simulation-based model while also providing substantial speed enhancements relative to the simulation-based model.

In some embodiments, the transformed model further provides mathematical differentiability. For example, the transformed model may generate sensitivity metrics associated with estimations of the sensitivity of the any of the output parameters to variations of process parameters of interest. Any suitable sensitivity metrics may be generated such as, but not limited to, analytical model gradients. Analytical model gradients are generally described in Griewank, Andreas. "Who invented the reverse mode of differentiation." Documenta Mathematica, Extra Volume ISMP 389400 (2012); and Baydin, Atilim Gunes, et al. "Automatic differentiation in machine learning: a survey." Journal of Marchine Learning Research 18 (2018): 1-43; both of which are incorporated herein by reference in their entireties.

Further, the transformed model may provide sensitivity metrics for each output parameter (e.g., local photoresist thickness, a stochastic defect rate based on the photoresist thickness, or the like) to selected input parameters alone or sensitivity metrics for combinations of output parameters. As an illustration, a sensitivity metric may provide an indication of how sensitive the local photoresist thickness and/or a stochastic defect rate (e.g., output parameters of the transformed model) of a particular candidate mask design is to variations of process parameters. Put another way, a sensitivity metric may provide an indication of how deviations of process parameters that occur during fabrication may impact the photoresist thickness and/or the stochastic defect rate. It is contemplated herein that such information may be utilized to make corrective design changes to reduce the sensitivity of the design to these process variations.

In some embodiments, the method 300 includes a step 306 of receiving a candidate mask design. In some embodiments, the method 300 includes a step 308 of generating a repaired mask design based on the transformed model. The candidate mask design and/or the repaired mask design may be provided in any suitable format such as, but not limited to, binary representation, polygon representation, distance-field representation, or level-set representation. Further, the repaired mask design may be provided either as a complete design or as update vectors describing modifications to the candidate mask design.

It is contemplated herein that the step 308 may utilize the transformed model in a wide variety of ways to generate a repaired mask design. In any case, the repaired mask design may provide reduced stochastic defect rates and may further be robust to process variations (e.g., as characterized by the transformed model).

Figure 3B:
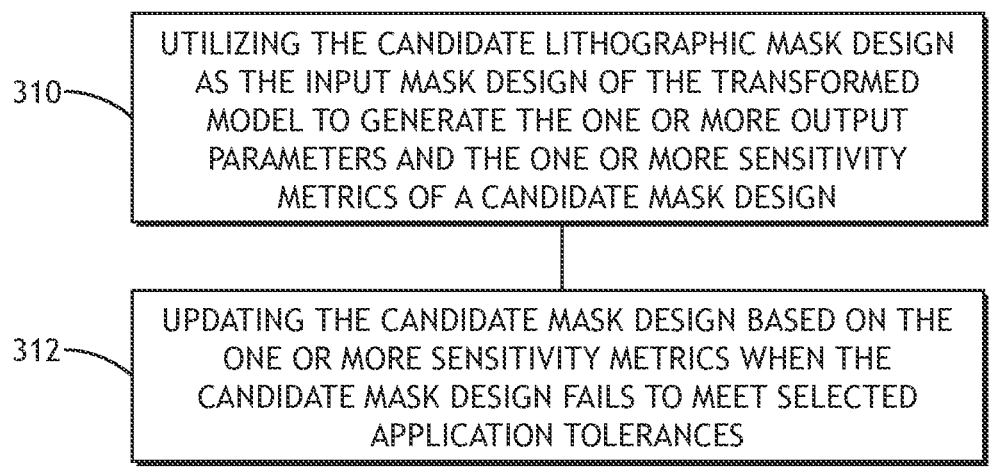
FIG. 3B is a flow diagram illustrating additional steps of the method of FIG. 3A, in accordance with one or more embodiments of the present disclosure.

FIG. 3B is a flow diagram illustrating sub-steps of the step 308 of generating a repaired mask design, in accordance with one or more embodiments of the present disclosure.

In some embodiments, the step 308 includes a step 310 of utilizing the candidate mask design as the input mask design of the transformed model to generate the one or more output parameters and the one or more sensitivity metrics of a candidate mask design. In some embodiments, the step 308 includes a step 312 of updating the candidate mask design based on the one or more sensitivity metrics when the candidate mask design fails to meet application tolerances (e.g., within a selected tolerance). For example, step 312 may include updating the design of the mask 106 based on the sensitivity metrics such that an updated candidate design is less sensitive to variations of the input parameters (e.g., process parameters).

In some embodiments, the steps 310 and 312 are iterated as necessary until a repaired mask design is generated that meets the application tolerances. Any application tolerances may be considered such as, but not limited to, tolerances related stochastic defect rate.

Figure 5:
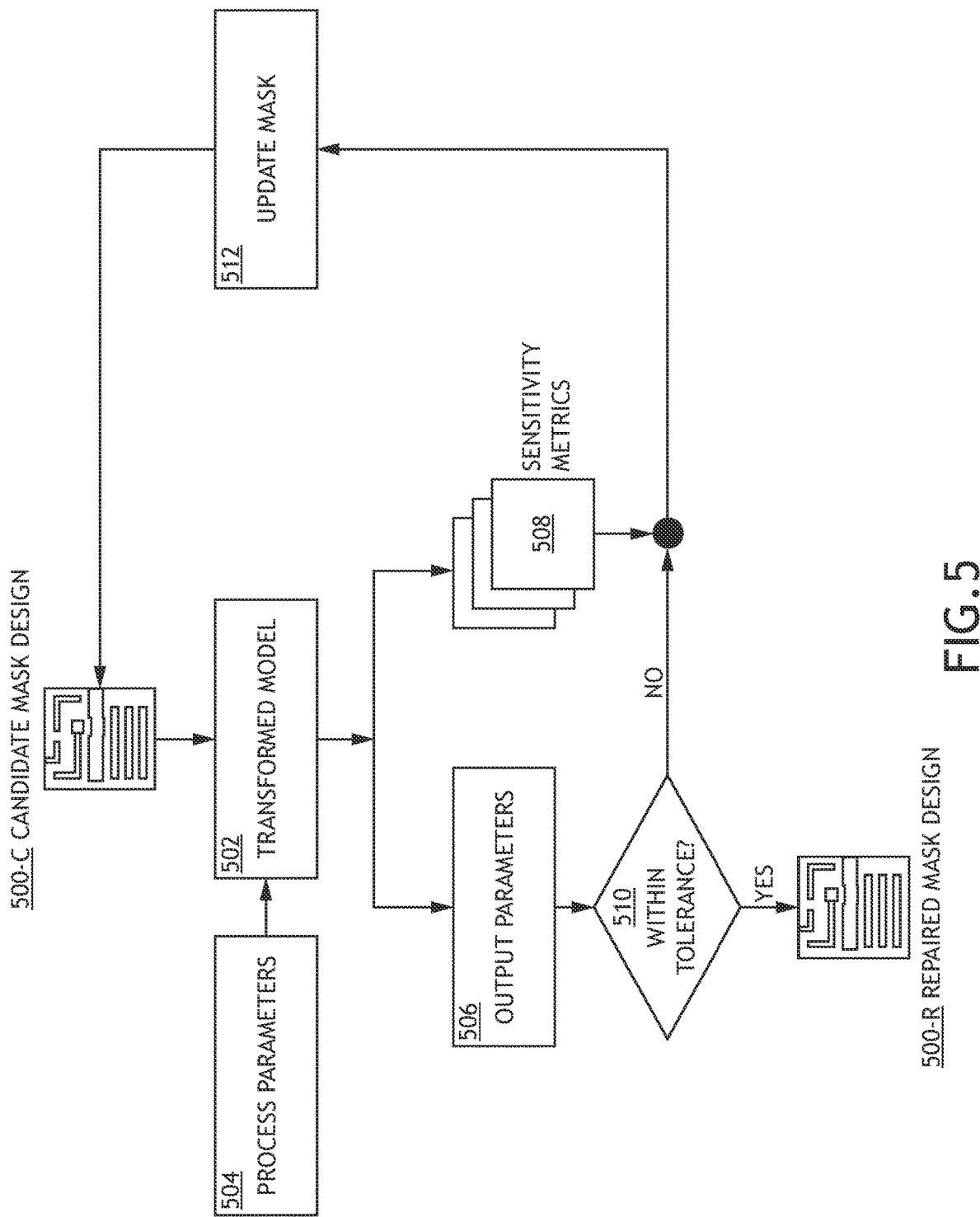
FIG. 5 is a simplified flow diagram illustrating stochastic defect mitigation, in accordance with one or more embodiments of the present disclosure.

FIG. 5 is a simplified flow diagram illustrating stochastic defect mitigation, in accordance with one or more embodiments of the present disclosure. In particular, FIG. 5 depicts a process in which a candidate mask design 500-C (e.g., a design of a candidate mask design 500-C) is provided as input to the transformed model 502 (e.g., as generated in step 304), along with additional process parameters 504 of interest. For instance, the process parameters 504 may include values and/or ranges of process parameters 504 within the input space covered by the transformed model 502. The transformed model 502 may then generate (e.g., in step 310) any number of output parameters 506 such as, but not limited to, local photoresist thickness, stochastic defect rate based at least in part on the local photoresist thickness, edge placement error, LER, CDU, distance field violations, or mask rule check parameters. The transformed model 502 may also generate (e.g., in step 310) sensitivity metrics 508 associated with any of the output parameters 506, either alone or in one or more combinations.

FIG. 5 further illustrates determining (e.g., box 510) whether application tolerances are met (e.g., as a part of step 312). If the tolerances are met, a repaired mask design 500-R (e.g., a design of a repaired mask design 500-R) is provided. Otherwise, the design is updated (e.g., box 512) to generate an updated candidate mask design 500-C. This process may be repeated as necessary until the application tolerances are met (e.g., satisfied). Any application tolerances may be considered such as, but not limited to, tolerances related stochastic defect rate.

Referring now to FIGS. 6A-8B, non-limiting variations of the method 300 (and the flow diagram in FIG. 5) are described.

The method 300 (e.g., step 308) may apply corrections or repairs to the entirety of a candidate mask design 500-C or portions of the candidate mask design 500-C. For example, applying corrections to a portion of the candidate mask design 500-C rather than the entirety of the candidate mask design 500-C may reduce computational speed. In the case where only portions of the candidate mask design 500-C are corrected, the portions may be determined using any suitable technique.

In some embodiments, regions of interest (ROIs) may be selected for repair using the method 300 (either in whole or for a particular iteration). These ROIs may be selected using any criteria. For instance, ROIs may correspond to features or sample locations prone to stochastic defects. In another instance, ROIs may correspond to features or sample locations that are particularly crucial to device performance.

In some embodiments, the portions of the candidate mask design 500-C selected for repair are selected based on filtering (e.g., prior to updating the candidate mask design 500-C). For example, the output parameters 506 of the transformed model may identify one or more areas on the sample 104 as potentially problematic based on a current candidate mask design 500-C. For instance, the output parameters 506 of the transformed model may predict one or more hotspots as having relatively high stochastic defect probabilities when fabricated using the candidate mask design 500-C. It may be possible to mitigate such problematic areas through a multitude of adjustments to various portions of the candidate mask design 500-C (e.g., a multitude of different combinations of adjustments to different edge positions). However, it may not be desirable to incorporate all identified potential adjustments to the candidate mask design 500-C. For example, some adjustments may be redundant. As another example, some adjustments may repair the identified problematic area but may negatively impact a different area. Accordingly, in some embodiments, only a subset of potential adjustments to the candidate mask design 500-C are implemented in a particular iteration. As an illustration, a selected percentage of locations for adjustment having sensitivity metrics 508 indicating the highest sensitivity to the output parameters 506 may be selected for repair (e.g., a top X % of locations, where X may be any selected value such as, but not limited to, 10%). As another illustration, locations having a sensitivity metric beyond a selected threshold (e.g., defining a magnitude of the sensitivity) may be selected for repair. Further, the filtering conditions may be individually adjusted for each iteration, either dynamically or based on predefined rules. As an illustration, it may be desirable to gradually decrease a number and/magnitude of corrections to a candidate mask design 500-C over successive iterations to promote convergence to a robust design.

Figure 6A:
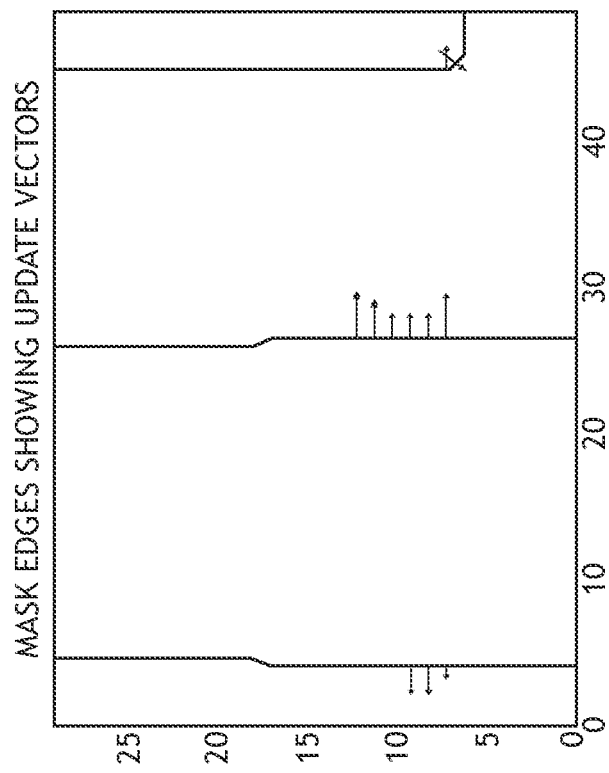
FIG. 6A is a simplified view of a repaired mask shown in the form of update vectors on feature edges, in accordance with one or more embodiments of the present disclosure.
Figure 6B:
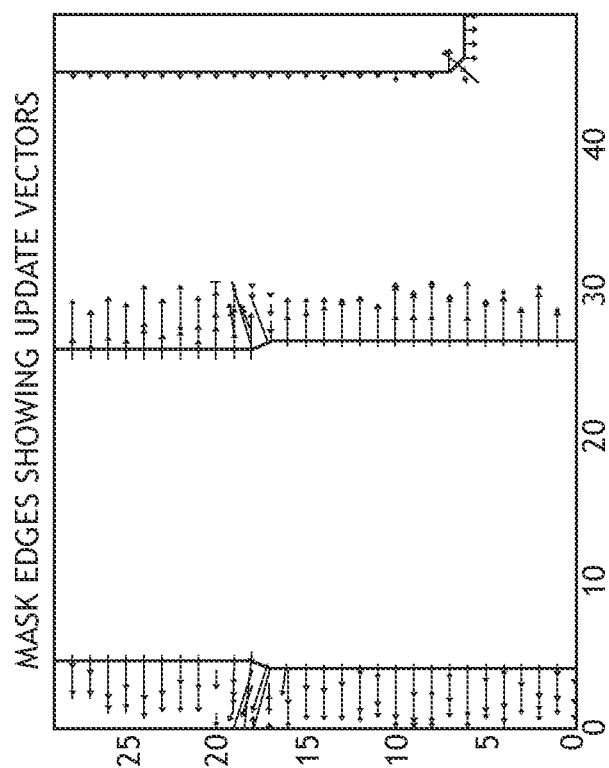
FIG. 6B is a simplified view of a repaired mask shown in the form of update vectors on feature edges where only a subset of sample locations are repaired, in accordance with one or more embodiments of the present disclosure.

FIGS. 6A and 6B illustrate repair on selected portions of a sample 104. In FIGS. 6A and 6B, the transformed model 502 provides output parameters 506 including stochastic defect rate and edge placement error in the photoresist (e.g., after lithographic exposure). FIG. 6A is a simplified view of a repaired mask design 500-R shown in the form of update vectors on feature edges generated through multiple iterations of step 308, in accordance with one or more embodiments of the present disclosure. For example, the various arrows indicate the direction and magnitude of an edge position modification identified for adjustment in a particular iteration. As illustrated, the magnitude and/or direction of the update vectors in a repaired mask design 500-R may vary across the sample 104 and between different iterations. FIG. 6B is a simplified view of a repaired mask design 500-R shown in the form of update vectors on feature edges through multiple iterations of step 308 where only a subset of the sample locations is repaired, in accordance with one or more embodiments of the present disclosure. For example, FIG. 6B is substantially similar to FIG. 6A, except that it only includes updates associated with a portion of the sample 104, where the shown locations may be selected based on defining ROIs, filtering, or any other suitable technique. In particular, FIG. 6B is generated based on filtering a set of potential modifications to a candidate mask design 500-C based on the sensitivity metrics 508 to include a selected percentage of modifications providing highest sensitivities to the output parameters 506.

Figure 7:
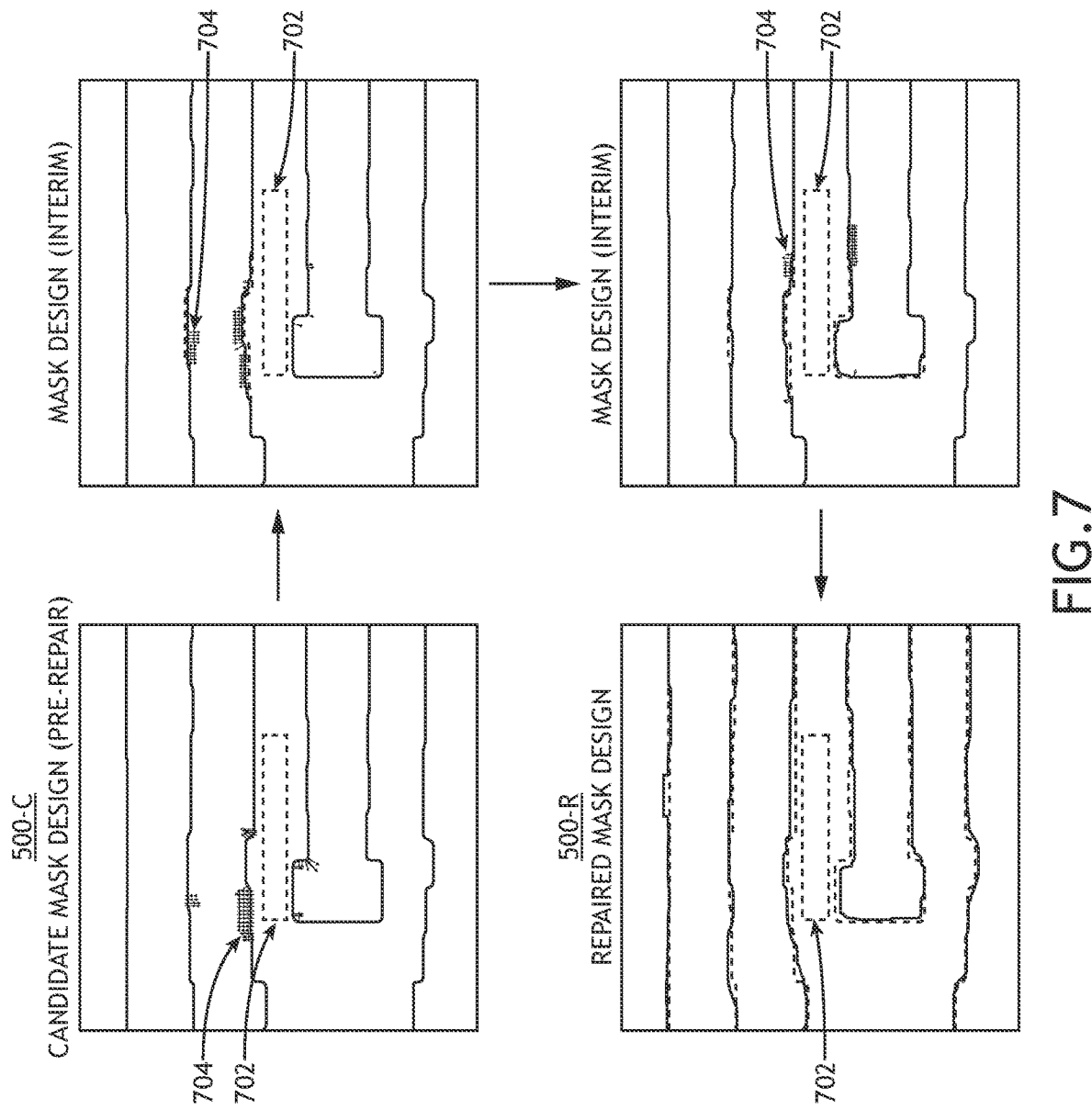
FIG. 7 is an illustration of iterative mask repair in a region of interest (ROI), in accordance with one or more embodiments of the present disclosure.

FIG. 7 is an illustration of iterative mask repair in an ROI 702 using the method 300, in accordance with one or more embodiments of the present disclosure. In FIG. 7, the transformed model 502 provides output parameters 506 including stochastic defect rate within the ROI 702, stochastic defect rate outside of the ROI 702, and edge placement error in the photoresist (e.g., after a lithographic exposure).

In particular, FIG. 7 depicts views of an initial candidate mask design 500-C (e.g., a pre-repair candidate mask design 500-C, two interim masks associated with iterations of step 308, and a final repaired mask design 500-R. In this way, the two interim masks represent both a repaired mask design 500-R from one iteration and a candidate mask design 500-C for a subsequent iteration. Further, FIG. 7 depicts arrows 704 illustrating reparative modifications to the shown candidate mask design 500-C (e.g., implemented in box 512 of FIG. 5). For reference, the initial design is also shown as dashed lines such that the impact of the design changes over the various iterations may be visualized.

In the flow shown in FIG. 7, decisions about whether the design as a whole meets the selected tolerances (e.g., box 510 in FIG. 5) are based at least in part on the ROI 702 (e.g., the stochastic defect rate within the ROI 702). In particular, the method 300 may continue to iterate until the locations within the ROI 702 meet the selected tolerances. In some embodiments, the method 300 may additionally iterate until the locations outside the ROI 702 meet additional tolerances, which may be different than the tolerances for areas within the ROI 702. Additionally, it is noted that filtering techniques as described previously herein (e.g., with respect to FIGS. 6A-6B) may also be applied to limit reparative corrections based on any of the output parameters 506.

Referring again generally to FIGS. 3 and 5, the step 312 of updating the candidate mask design 500-C (e.g., box 512) may be tailored to the manner in which a design is expressed. For example, the step 312 of updating the candidate mask design 500-C (e.g., box 512) may include updating mask polygons, where the mask polygons may correspond to the feature design directly or as a parameter in a distance-field and/or level set technique. Further, updating mask polygons is not limited to modifying existing polygons, but may also include adding new polygons and/or removing existing polygons. Any type of updating or optimization technique may be utilized including, but not limited to, a gradient descent optimization technique. As another example, the step 312 of updating the candidate mask design 500-C (e.g., box 512) may include updating distance-field and/or level-set parameters when used to represent the design. In some embodiments, the step 312 of updating the candidate mask design 500-C (e.g., box 512) may further control and/or manage parameters relevant to the manner in which a design is expressed. For example, the step 312 of updating the candidate mask design 500-C (e.g., box 512) may further control and/or manage a speed field to obey a Courant-Friedrichs-Lewy (CFL) condition or the like when using level-set or fast-marching techniques.

In some embodiments, the method 300 (e.g., step 308) may generate a repaired mask design 500-R in two or more phases having different tolerance conditions, where the steps 310 and 312 may be iterated as necessary to achieve the associated tolerance conditions.

For example, the flow in FIG. 5 may be performed a first time in a first phase to generate a first repaired mask design 500-R of an initial candidate mask design 500-C. Subsequently, the flow in FIG. 5 may be performed a second time in a second phase, where the first repaired mask design 500-R is provided as a candidate mask design 500-C for the second phase to generate a second (e.g., final) repaired mask design 500-R. As an illustration, the output parameters 506 of the first phase may include a stochastic defect rate within one or more ROIs (e.g., as shown illustratively in FIG. 7), a stochastic defect rate outside the one or more ROIs, and edge placement errors. Updates to the candidate mask design 500-C (e.g., box 512) may then be performed for the entire sample 104, the ROIs alone, or for a filtered set of locations as described above. The output parameters 506 in the second phase may then further include mask rule check violations. It is contemplated herein that such a two-phase operation may provide efficient repair during a first phase without spending computational resources and associated time on mask rule check violations until a certain level of performance is reached in the first phase. The second phase may then make any additional modifications as needed to avoid mask rule check violations. It is noted, however, that this example is provided merely for illustration and should not be interpreted to be limiting. In a general sense, multiphase implementations may allow mask corrections based on multiple combinations of output parameters in a controlled and efficient way.

Figure 8A:
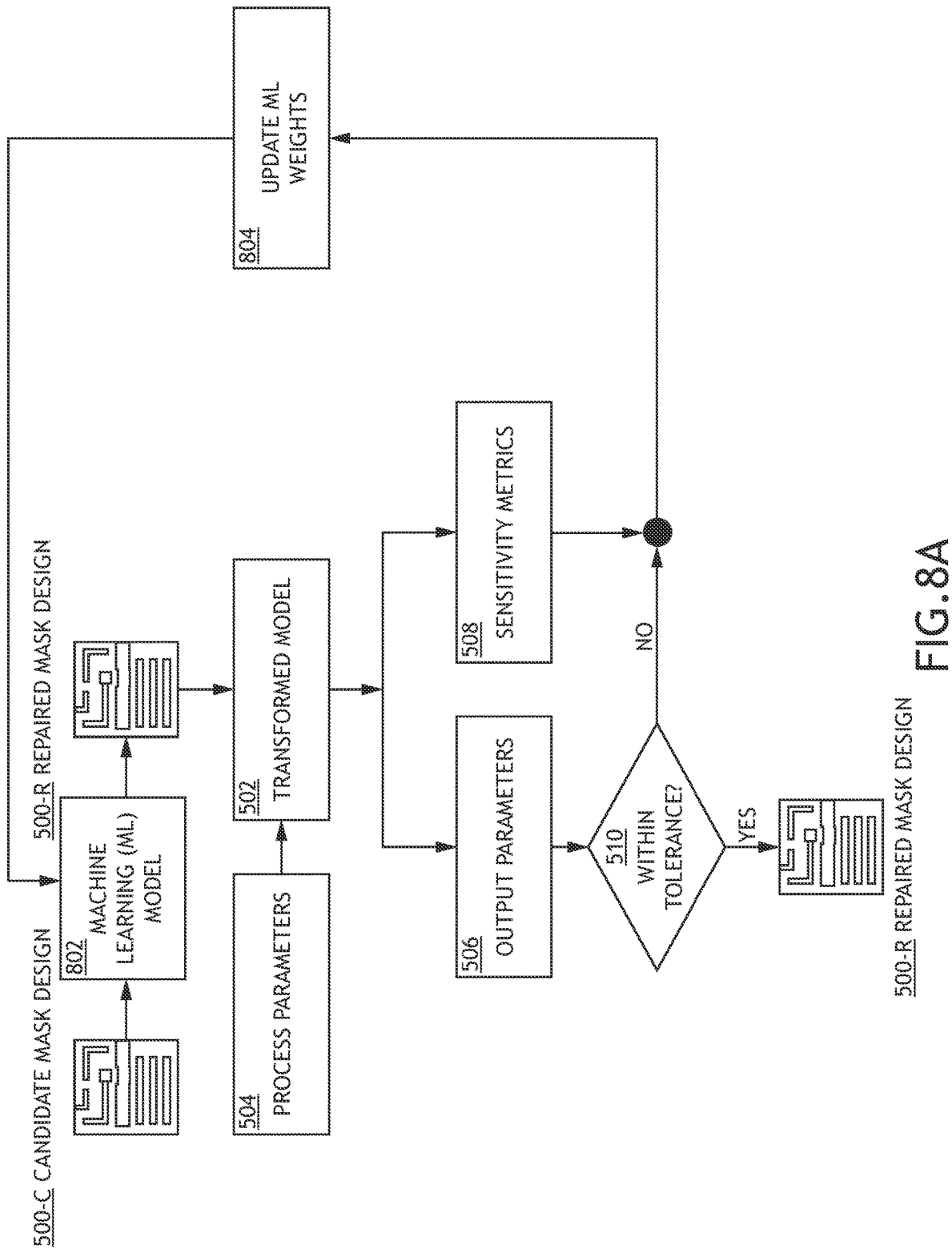
FIG. 8A is a simplified flow diagram illustrating training a machine learning model using the transformed model, in accordance with one or more embodiments of the present disclosure.
Figure 8B:
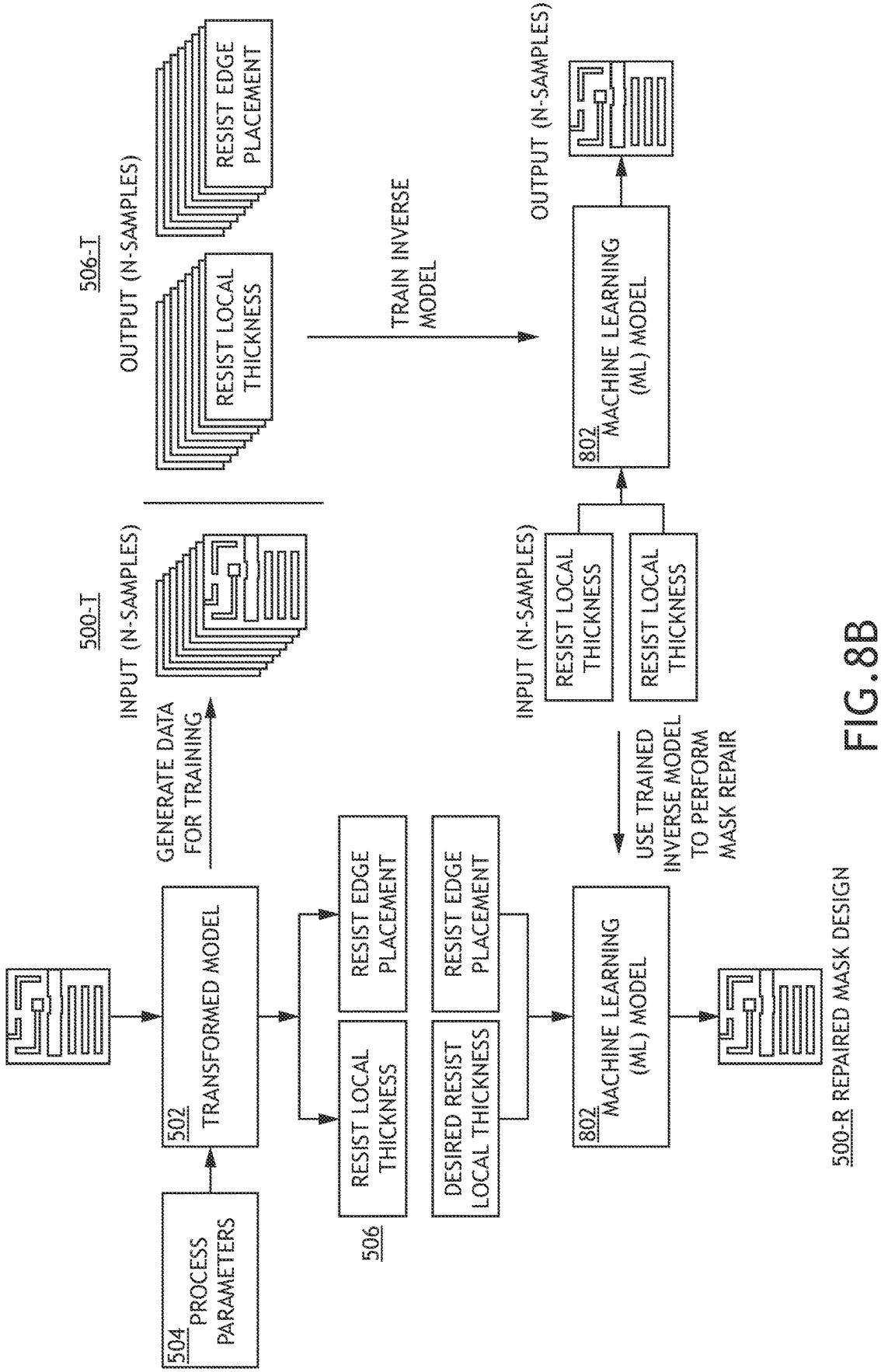
FIG. 8B is a flow diagram illustrating a non-limiting example of training a machine learning model based on training data generated by the transformed model, in accordance with one or more embodiments of the present disclosure.

Referring now to FIGS. 8A and 8B, in some embodiments, the transformed model 502 (e.g., generated in step 304) may be used to train a machine learning model (e.g., an inverse machine learning model) to directly generate a repaired mask design 500-R from a candidate mask design 500-C.

FIG. 8A is a simplified flow diagram illustrating training a machine learning model 802 using the transformed model 502, in accordance with one or more embodiments of the present disclosure.

In some embodiments, the machine learning model 802 generates a repaired mask design 500-R from an input candidate mask design 500-C. This repaired mask design 500-R may then be provided as an input to the transformed model 502 (e.g., generated in step 304), which may provide output parameters 506 and sensitivity metrics 508. Further, in some embodiments, the sensitivity metrics 508 include sensitivities of machine learning weights of the machine learning model 802 to the output parameters 506. In this way, the sensitivity metrics 508 may characterize a sensitivity of the machine learning model 802 to the output parameters 506 (e.g., stochastic defect rate, or the like). If the repaired mask design 500-R from the machine learning model 802 does not meet the selected application tolerances, then the machine learning model 802 may be updated (box 804) based on the sensitivity metrics 508. Further, this process may be repeated until the repaired mask design 500-R generated by the machine learning model 802 meets (e.g., satisfies) the application tolerances.

FIG. 8B is a flow diagram illustrating a non-limiting example of training the machine learning model 802 based on training data generated by the transformed model 502, in accordance with one or more embodiments of the present disclosure. It is noted that FIG. 8B illustrates a particular non-limiting case in which the output parameters 506-T include local resist thickness and resist edge placement values.

In some embodiments, the transformed model 502 generates output parameters 506-T as training data based on multiple input candidate mask designs 500-T. For example, the input candidate mask designs 500-T may be fabricated with known variations of the process parameters (e.g., within a covered input space). Once trained, the machine learning model 802 may directly generate a repaired mask design 500-R based on any suitable inputs including, but not limited to, an input candidate mask design 500-C or desired values of the output parameters as illustrated in FIG. 8B.

Figure 9A:
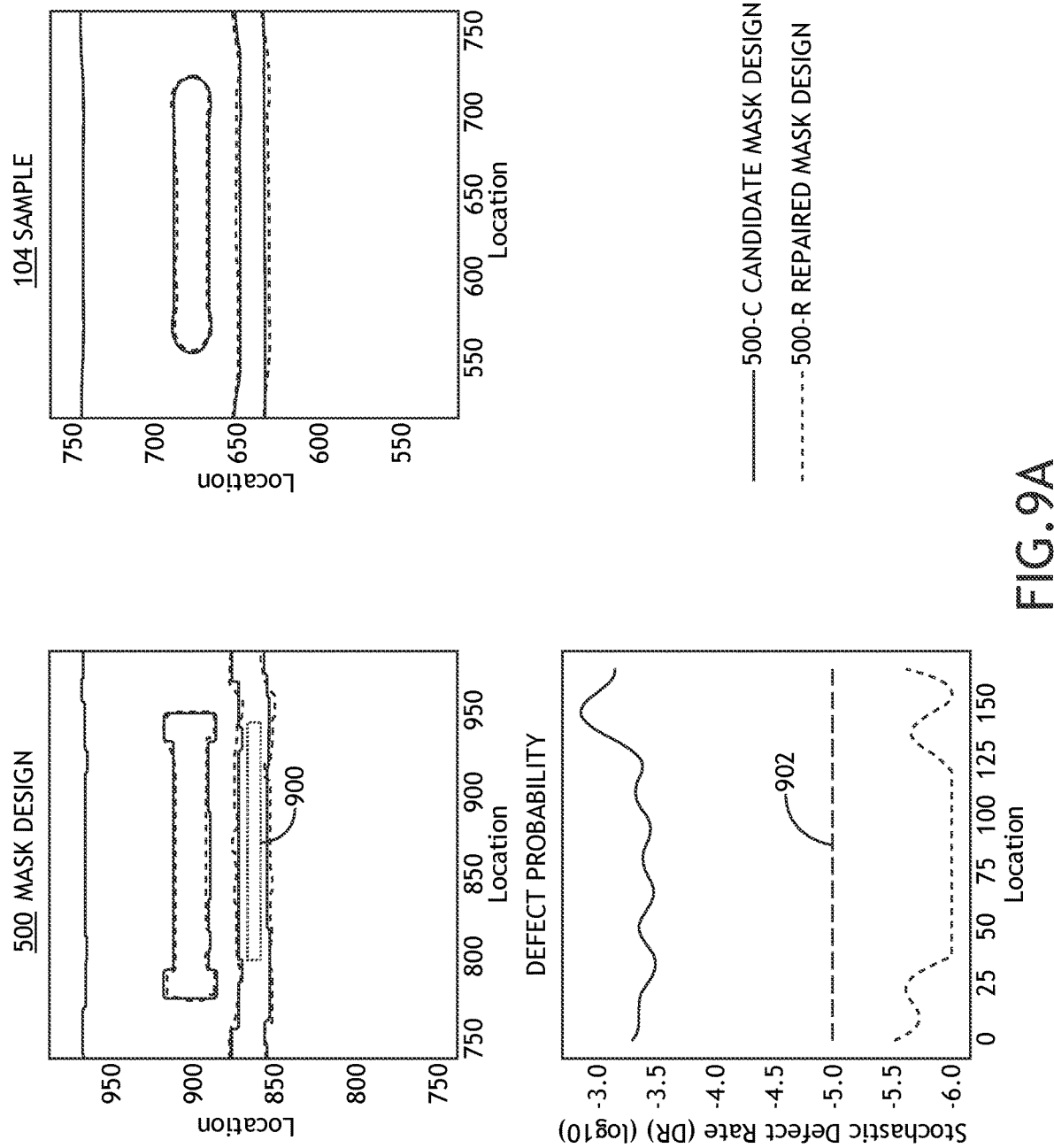
FIGS. 9A-9D include a series of plots illustrating additional non-limiting examples of repairing masks, in accordance with one or more embodiments of the present disclosure.
Figure 9B:
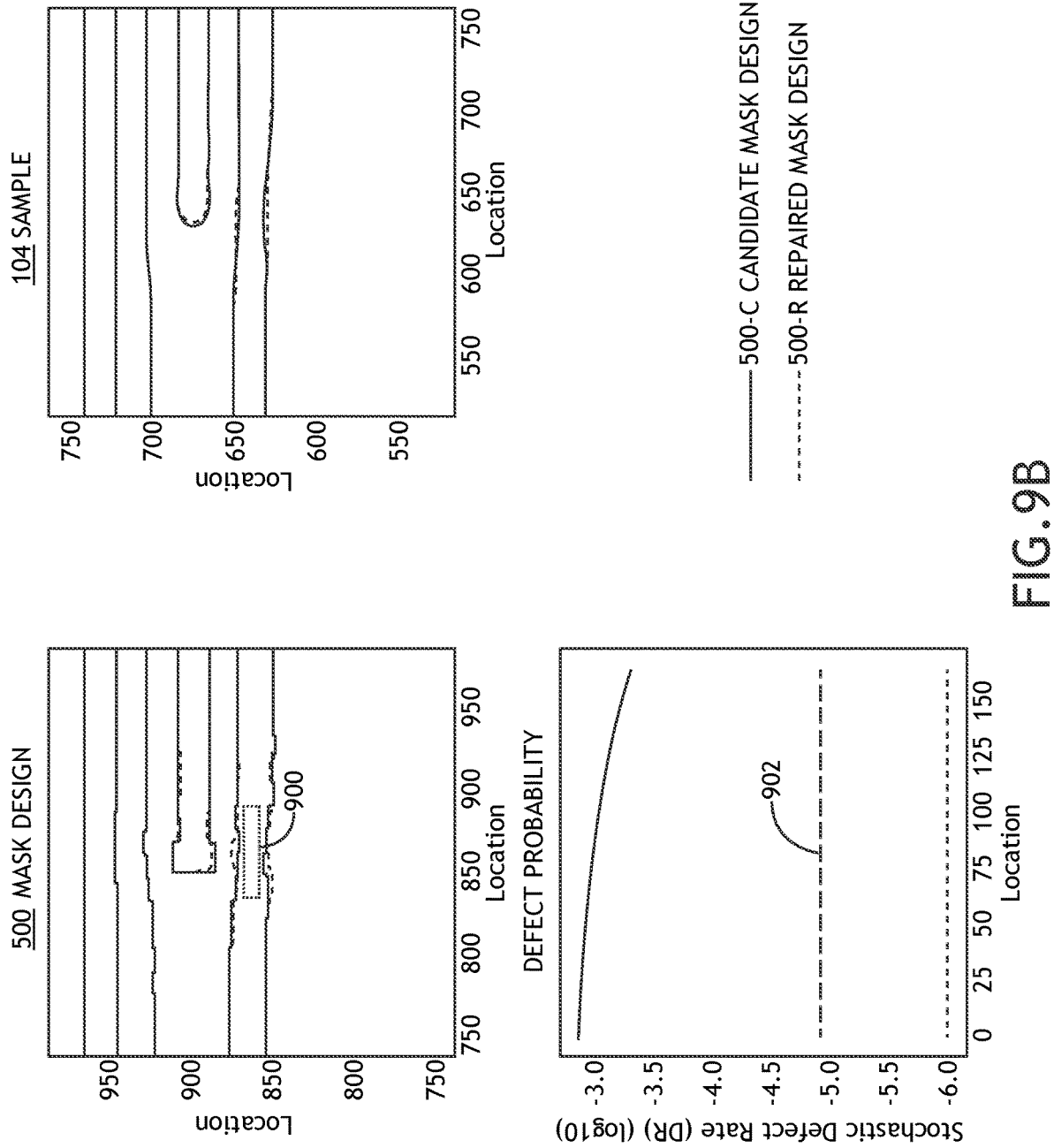
Figure 9C:
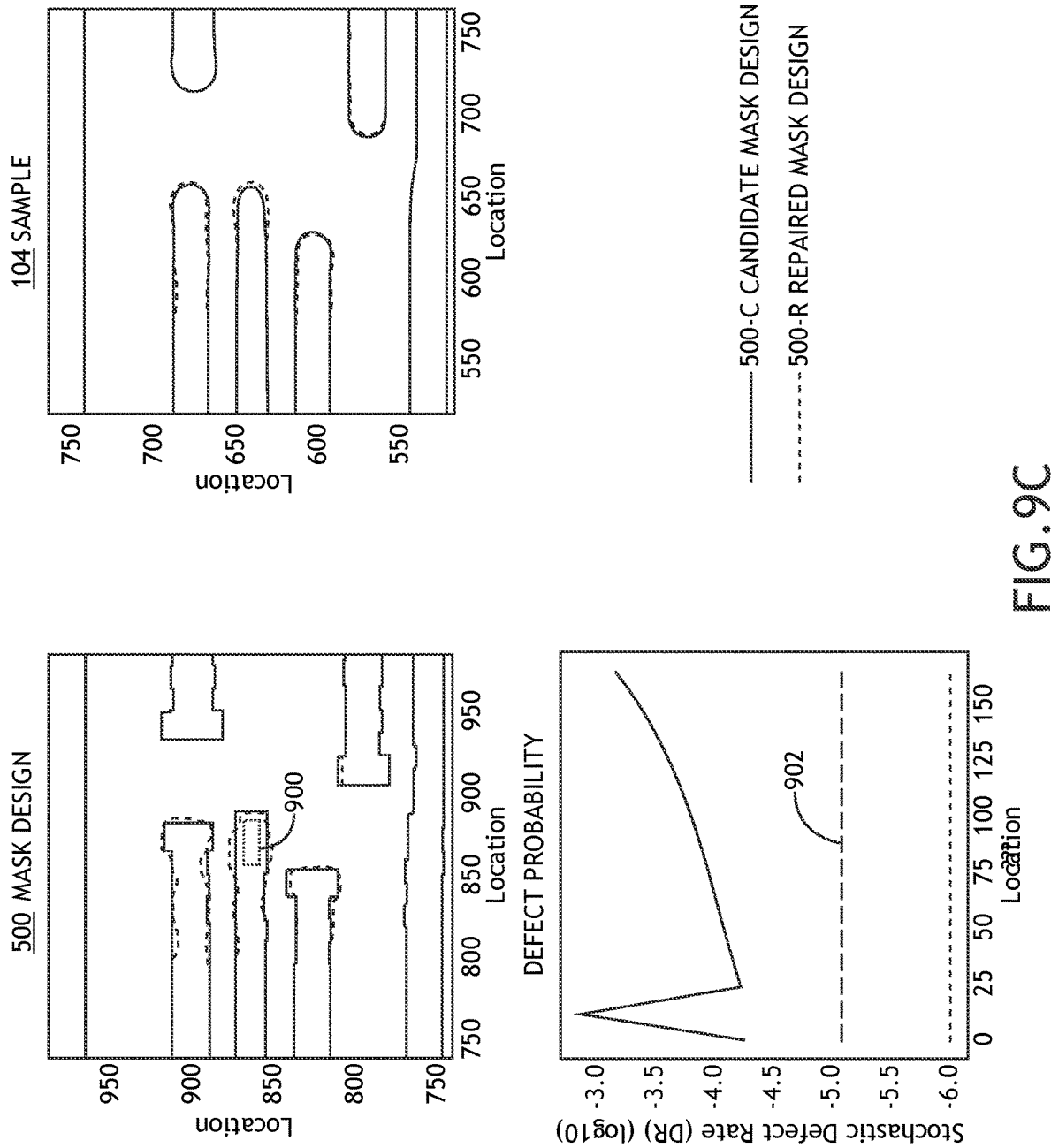
Figure 9D:
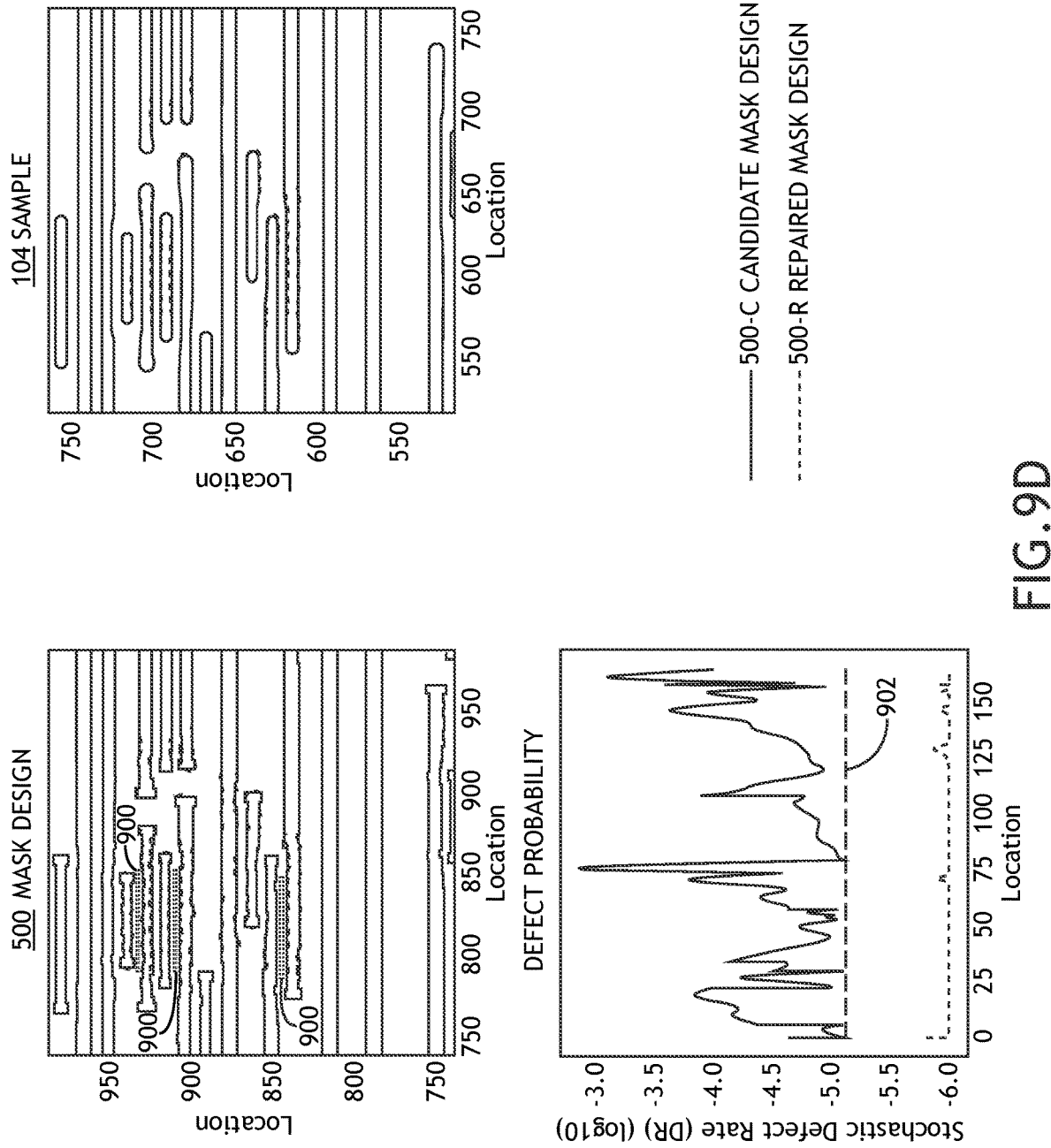

Referring now to FIGS. 9A-9D, FIGS. 9A-9D include a series of plots illustrating additional non-limiting examples of repairing mask designs 500 using the method 300, in accordance with one or more embodiments of the present disclosure. Each of FIGS. 9A-9D includes an image of a simplified top view labeled "Mask Design" depicting a candidate mask design 500-C and a repaired mask design 500-R generated using the systems and methods disclosed herein. Each of FIGS. 9A-9D further includes an image of a simplified top view of a sample 104 with predicted features in an exposed photoresist layer fabricated based on the associated mask designs 500. It is noted that the predicted features associated with the different mask designs 500 are overlaid to illustrate the differences. Each of FIGS. 9A-9D further includes a plot of stochastic defect rate (DR) for the associated mask designs 500. Further, FIGS. 9A-9C depict configurations providing repair based on a single ROI 900, whereas FIG. 9D depicts configurations providing repair based on multiple ROIs 900. In every case, the method 300 provides a substantial reduction of the probability of stochastic defects. Additionally, in each case, the stochastic defect rate of the associated repaired mask design 500-R is below application tolerances (e.g., illustrated as dashed line 902).

Figure 10:
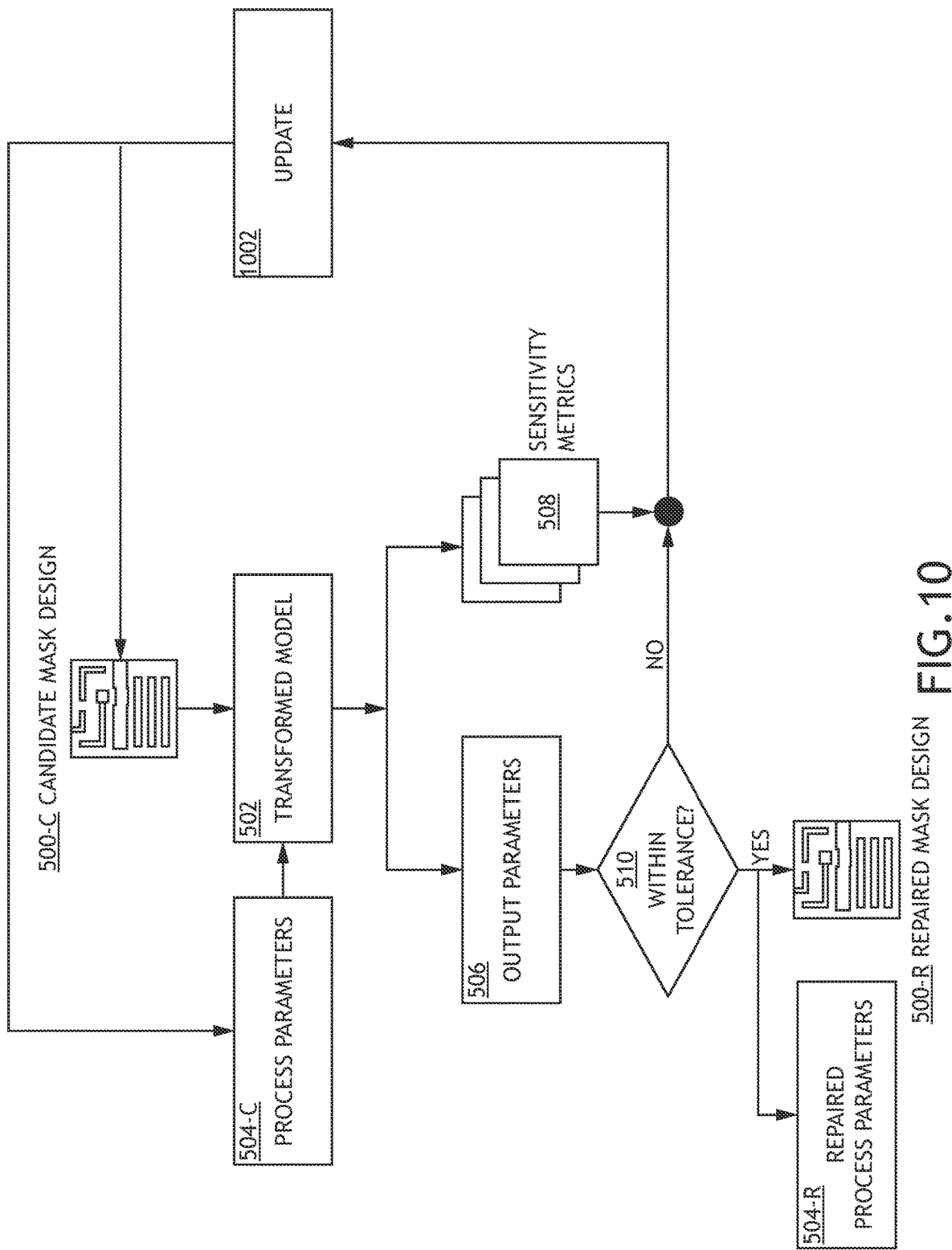
FIG. 10 is a simplified flow diagram illustrating stochastic defect mitigation, in accordance with one or more embodiments of the present disclosure.

Referring now to FIG. 10, mitigation of stochastic defects through modifications to process parameters instead of or in addition to a design of a mask 106 is described, in accordance with one or more embodiments of the present disclosure. It is contemplated herein that a defect rate (e.g., a stochastic defect rate) may be influenced by not only the design of the mask 106 used for lithography, but also by various process parameters such as, but not limited to, dose, focus position, illumination numerical aperture, illumination source shape, post-exposure bake temperature, development time, or the like. Accordingly, process parameters may be adjusted in addition to or instead of the mask design to mitigate stochastic defects.

In some embodiments, a fabrication process is governed by or otherwise described by a recipe, which may include parameters describing various aspects of the sample 104 to be fabricated and/or process tools (lithography tools, etching tools, polishing tools, or the like) used at any process step. In this way, the recipe may include the process parameters 504 associated with any process step. For example, the recipe may include process parameters 504 associated with a sample 104 at any process step including, but not limited to, a thickness of a film to be deposited or a composition of a film to be deposited. As another example, the recipe may include the design of the mask 106 used in a lithography step. As another example, the recipe may include process parameters 504 for a lithography step such as, but not limited to illumination dose, illumination wavelength, illumination polarization, illumination source shape, exposure time, or focus position of the sample 104. As another example, the recipe may include process parameters 504 associated with an etching step including, but not limited to, a composition of an etchant or an etch duration. As another example, the recipe may include process parameters 504 associated with a post-exposure bake step including, but not limited to, a temperature or a duration of a bake.

In some embodiments, reparative corrections (e.g., updates) may be made to any aspect of the recipe to mitigate stochastic defects (e.g., reduce a stochastic defect rate) based on the transformed model 502. Thus, the teachings of the present disclosure related to providing reparative corrections to a mask design 500 may be extended to providing reparative corrections to a recipe describing one or more process steps more generally.

For example, any component of a recipe may be iteratively modified (e.g., updated) based on the transformed model 502. FIG. 10 is a simplified flow diagram illustrating stochastic defect mitigation, in accordance with one or more embodiments of the present disclosure. It is noted that FIG. 10 is substantially similar to FIG. 5 except that box 512 of FIG. 5 signifying updating a mask design 500 is replaced with box 1002 signifying updating a recipe describing a fabrication process. As illustrated in FIG. 10, the transformed model 502 may accept as inputs any process parameters 504 (e.g., candidate process parameters 504-C) as well as the mask design 500 (e.g., a candidate mask design 500-C) and provide output parameters 506 and associated sensitivity metrics 508. If the output parameters 506 are not within application tolerances, then any aspect of the recipe may be updated (box 1002) including mask design 500 alone, any process parameters 504 alone, and/or a combination of the mask design 500 and any process parameters 504. If the output parameters 506 are within the application tolerances, a repaired mask design 500-R and/or repaired process parameters 504-R (e.g., a repaired recipe more generally) may be provided as an output.

As another example, the machine learning model 802 depicted in FIGS. 8A-8B may be extended to provide a repaired recipe based on a candidate recipe. For instance, the machine learning model 802 may be trained to accept a candidate mask design 500-C and/or a candidate process parameters 504-C and generate a repaired mask design 500-R and/or a repaired process parameters 504-R based on training data including relevant process parameters. Accordingly, FIG. 8B may be extended to include process parameters 504 within a training dataset and provide associated outputs.

Figure 1B:
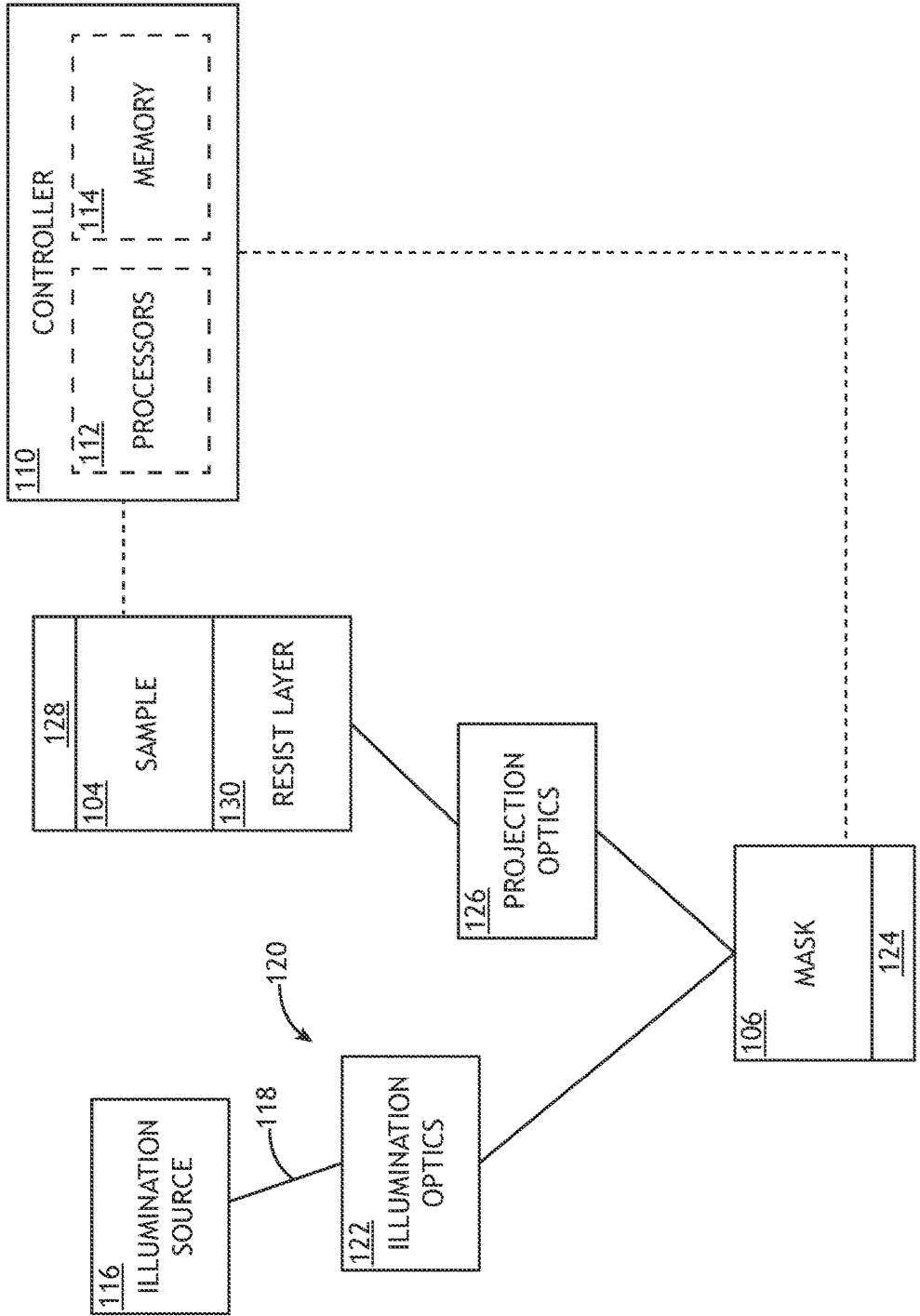
FIG. 1B is a conceptual view illustrating the lithography sub-system, in accordance with one or more embodiments of the present disclosure.
Figure 1C:
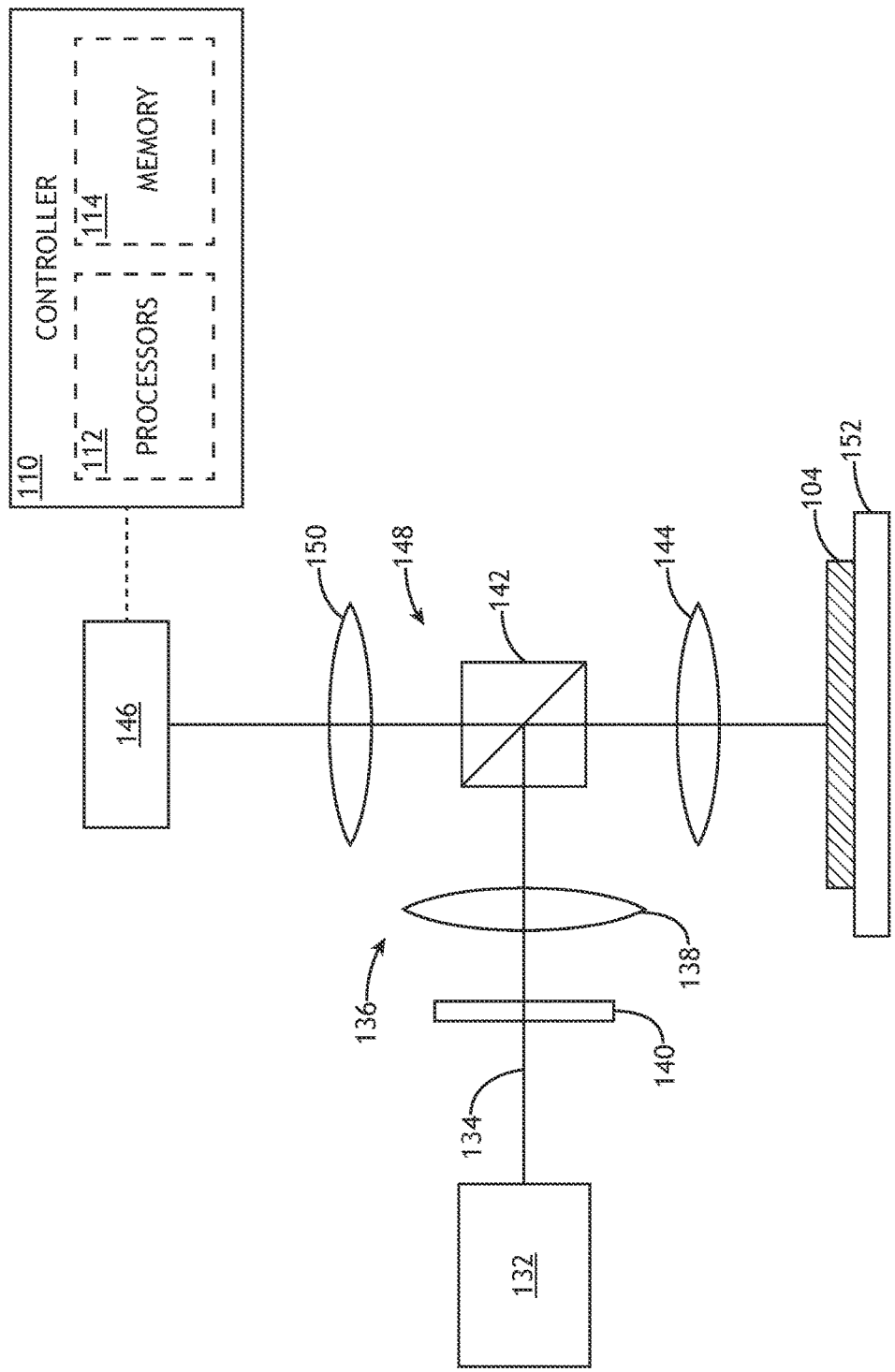
FIG. 1C is a conceptual view illustrating the characterization sub-system, in accordance with one or more embodiments of the present disclosure.

Referring now generally to FIGS. 1A-1C, additional aspects of the system 100 are described in greater detail, in accordance with one or more embodiments of the present disclosure.

FIG. 1B is a conceptual view illustrating the lithography sub-system 102, in accordance with one or more embodiments of the present disclosure. In some embodiments, the lithography sub-system 102 includes an illumination source 116 configured to generate one or more illumination beams 118. The illumination beam 118 may include one or more selected wavelengths of light including, but not limited to, EUV light. For example, at least a portion of a spectrum of the illumination beam 118 may include wavelengths such as, but not limited to, 13.5 nm, or the like. EUV-based lithography is described generally in U.S. Pat. No. 8,916,831, issued on Dec. 23, 2014, which is incorporated herein by reference in the entirety.

In some embodiments, the illumination source 116 includes an extreme ultraviolet illumination source 116. For example, the EUV illumination source 116 may include a broadband plasma (BBP) illumination source. In this regard, the illumination beam 118 may include radiation emitted by a plasma. For example, a BBP illumination source 116 may include, but is not required to include, one or more pump sources (e.g., one or more lasers) configured to focus illumination into the volume of a gas, causing energy to be absorbed by the gas in order to generate or sustain a plasma suitable for emitting radiation. Further, at least a portion of the plasma radiation may be utilized as the illumination beam 118. In some embodiments, the illumination source 116 may include one or more lasers capable of emitting radiation at one or more selected wavelengths.

In some embodiments, the illumination source 116 directs the illumination beam 118 to a mask 106 via an illumination pathway 120. The illumination pathway 120 may include one or more illumination optics 122 suitable for directing, focusing, and/or shaping the illumination beam 118 on the mask 106. For example, the illumination optics 122 may include one or more lenses, one or more focusing elements, or the like. Further, the illumination optics 122 may include any reflective optical element known in the art suitable for directing and/or focusing the illumination beam 118. For instance, the illumination optics 122 may include reflective optics suitable for directing and/or focusing low-wavelength light (e.g., EUV light, and the like) such as, but not limited to, flat mirrors or curved mirrors (e.g., elliptical mirrors, parabolic mirrors, or the like).

The illumination optics 122 may further include one or more additional illumination pathway components suitable for shaping the illumination beam 118 and/or controlling a range of incidence angles of the illumination beam 118 on the mask 106 (e.g., an illumination pupil distribution). For example, the illumination pathway components may include, but are not limited to, one or more apertures, one or more apodizers, one or more homogenizers, one or more diffusers, one or more polarizers, or one or more filters.

In some embodiments, the lithography sub-system 102 includes a mask support device 124. The mask support device 124 may be configured to secure the mask 106.

In some embodiments, the lithography sub-system 102 includes a set of projection optics 126 configured to project an image of the mask 106 illuminated by the one or more illumination beams 118 onto the surface of a sample 104 disposed on a sample stage 128. For example, the set of projection optics 126 may be configured to project an image of the mask 106 onto a resist layer 130 on the sample 104 to generate (e.g., expose, or the like) a printed pattern element on the resist layer 130 corresponding to a pattern element on the mask 106. In some embodiments, the mask support device 124 may be configured to actuate or position the mask 106. For example, the mask support device 124 may actuate the mask 106 to a selected position with respect to the projection optics 126 of the lithography sub-system 102.

The mask 106 may be utilized (e.g., by the lithography sub-system 102) in any imaging configuration known in the art. For example, the mask 106 may be a positive mask (e.g., a bright-field mask) in which pattern elements are positively imaged as printed pattern elements of a resist layer 130 of sample 104. By way of another example, the mask 106 may be a negative mask (e.g., a dark-field mask) in which pattern elements of the mask 106 form negative printed pattern elements (e.g., gaps, spaces, or the like) of a resist layer 130 of sample 104.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, pattern mask, mask, and reticle, should be interpreted as interchangeable.

FIG. 1C is a conceptual view illustrating the characterization sub-system 108, in accordance with one or more embodiments of the present disclosure. It is noted that FIG. 1C depicts the characterization sub-system 108 as an optical system. However, this is merely illustrative and not limiting. Rather, the characterization sub-system 108 may include and/or be configured as a particle-beam system (e.g., an electron-beam system, an ion-beam system, or the like) or an x-ray system (e.g., including optical configurations suitable for light in x-ray spectral regions).

In some embodiments, the characterization sub-system 108 includes an illumination source 132 to generate an illumination beam 134. The illumination beam 134 may include one or more selected wavelengths of light including, but not limited to, ultraviolet (UV) radiation, visible radiation, or infrared (IR) radiation. It is noted herein that the characterization sub-system 108 may include any type of characterization sub-system 108 known in the art without limiting the scope of the present disclosure. For example, although not depicted in FIG. 1C, the characterization sub-system 108 may include an extreme violet (EUV) characterization sub-system, a deep ultraviolet (DUV) characterization sub-system, or the like without departing from the scope of the present disclosure.

In some embodiments, the illumination source 132 directs the illumination beam 134 to the sample 104 via an illumination pathway 136. The illumination pathway 136 may include one or more lenses 138. Further, the illumination pathway 136 may include one or more additional optical components 140 suitable for modifying and/or conditioning the illumination beam 134. For example, the one or more optical components 140 may include, but are not limited to, one or more polarizers, one or more filters, one or more beam splitters, one or more diffusers, one or more homogenizers, one or more apodizers, or one or more beam shapers. In some embodiments, the illumination pathway 136 includes a beamsplitter 142. In some embodiments, the characterization sub-system 108 includes an objective lens 144 to focus the illumination beam 134 onto the sample 104.

In some embodiments, the characterization sub-system 108 includes one or more detectors 146 configured to capture radiation emanating from the sample 104 through a collection pathway 148. The collection pathway 148 may include multiple optical elements to direct and/or modify illumination collected by the objective lens 144 including, but not limited to one or more lenses 150, one or more filters, one or more polarizers, one or more beam blocks, or one or more beamsplitters.

For example, a detector 146 may receive an image of the sample 104 provided by elements in the collection pathway 148 (e.g., the objective lens 144, the one or more lenses 150, or the like). By way of another example, a detector 146 may receive radiation reflected or scattered (e.g., via specular reflection, diffuse reflection, and the like) from the sample 104. By way of another example, a detector 146 may receive radiation generated by the sample (e.g., luminescence associated with absorption of the illumination beam 134, and the like). Further, it is noted herein that the one or more detectors 146 may include any optical detector known in the art suitable for measuring illumination received from the sample 104. For example, a detector 146 may include, but is not limited to, a CCD detector, a TDI detector, a photomultiplier tube (PMT), an avalanche photodiode (APD), or the like.

Additionally, in some embodiments, the characterization sub-system 108 includes a translation stage 152 to secure and position the sample 104.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
a controller including one or more processors configured to execute program instructions causing the one or more processors to:
develop a simulation-based model of a layer thickness after one or more process steps for fabricating features on a sample, wherein the simulation-based model accepts an input mask design to be exposed on the sample and provides at least the layer thickness after the one or more process steps as an output;
develop a transformed model of the fabrication process that emulates the simulation-based model and has a faster evaluation speed than the simulation-based model for a selected range of at least one of inputs or outputs, wherein the inputs to the transformed model include the input mask design, wherein the outputs of the transformed model include one or more output parameters associated with fabrication of the input mask design as well as one or more sensitivity metrics describing sensitivities of the one or more output parameters to variations of the input mask design, wherein the one or more output parameters include at least one of the layer thickness after the one or more process steps or a stochastic defect rate based on the layer thickness;
receive a candidate mask design; and
generate a repaired mask design based on the transformed model and the candidate mask design.

2. The system of claim 1, wherein the layer thickness comprises:
at least one of a thickness of a photoresist layer after a lithography process step or a thickness of a process layer after an etching step.

3. The system of claim 1, wherein the at least one of the simulation-based model or the transformed model provides at least one of the layer thickness or a probability of the layer thickness in a presence of process variations.

4. The system of claim 1, wherein the candidate mask design and the repaired mask design are represented by at least one of a binary representation, a polygon representation, a distance-field representation, or a level-set representation.

5. The system of claim 1, wherein generate the repaired mask design based on the transformed model and the candidate mask design comprises:
generate update vectors for at least some edges in the candidate mask design; and
update the candidate mask design with the update vectors to provide the repaired mask design.

6. The system of claim 1, wherein generate the repaired mask design based on the transformed model and the candidate mask design comprises iteratively performing the following steps until one or more application tolerances are satisfied:
utilize the candidate mask design as the input mask design of the transformed model to generate the one or more output parameters and the one or more sensitivity metrics of the candidate mask design; and
update the candidate mask design based on the one or more sensitivity metrics when the candidate mask design fails to meet the one or more application tolerances to provide the repaired mask design.

7. The system of claim 6, wherein the one or more application tolerances comprise:
a stochastic defect rate tolerance.

8. The system of claim 6, wherein update the candidate mask design based on the one or more sensitivity metrics when the candidate mask design fails to meet the application tolerances comprises:
generate update vectors for at least some edges in the candidate mask design based on the one or more sensitivity metrics; and
update the candidate mask design with the update vectors to generate the repaired mask design.

9. The system of claim 8, wherein update the candidate mask design based on the one or more sensitivity metrics when the candidate mask design fails to meet the application tolerances further comprises:
filter the update vectors to include only subset of the update vectors having sensitivies above a selected sensitivity threshold based on the one or more sensitivity metrics prior to updating the candidate mask design with the update vectors to generate the repaired mask design.

10. The system of claim 9, wherein the selected sensitivity threshold corresponds to a selected percentage of locations having highest sensitivies based on the one or more sensitivity metrics.

11. The system of claim 8, wherein generate the update vectors for at least some edges in the candidate mask design based on the one or more sensitivity metrics comprises:
generate the update vectors for at least some edges in the candidate mask design based on the one or more sensitivity metrics corresponding to one or more regions of interest.

12. The system of claim 8, wherein the candidate mask design and the repaired mask design are represented by a polygon representation defining a set of polygons, wherein update the candidate mask design with the update vectors comprises:
update the set of polygons in the candidate mask design with the update vectors using a gradient descent optimizer.

13. The system of claim 8, wherein the candidate mask design and the repaired mask design are represented by a level-set representation, wherein updating the candidate mask design with the update vectors comprises:
updating the candidate mask design with the update vectors using a speed field controlled to obey conditions for at least one of level-set or fast-marching techniques.

14. The system of claim 1, wherein generate the repaired mask design based on the transformed model and the candidate mask design comprises:
train a machine learning model with training data generated by the transformed model; and generate the repaired mask design with the machine learning model.

15. The system of claim 1, wherein the one or more output parameters comprise:
two or more output parameters, wherein the one or more sensitivity metrics comprise:
two sensitivity metrics, each associated with a different one of the two or more output parameters.

16. The system of claim 1, wherein the one or more output parameters comprise:
two or more output parameters, wherein at least one of the one or more sensitivity metrics comprises:
a combined sensitivity metric associated with a combination of at least two of the two or more output parameters.

17. The system of claim 1, wherein the one or more output parameters comprise:
the layer thickness, the stochastic defect rate based on the layer thickness, and an edge placement error.

18. The system of claim 1, wherein the one or more output parameters comprise:
the stochastic defect rate based on the layer thickness.

19. The system of claim 1, wherein the one or more output parameters comprise:
the stochastic defect rate based on the layer thickness and an edge placement error.

20. The system of claim 1, further comprising:
a lithography sub-system configured to expose one or more samples with patterns based on the repaired mask design.

21. A method comprising:
developing a simulation-based model of a layer thickness after one or more process steps for fabricating features on a sample, wherein the simulation-based model accepts an input mask design to be exposed on the sample and provides at least the layer thickness after the one or more process steps as an output;
developing a transformed model of the fabrication process that emulates the simulation-based model and has a faster evaluation speed than the simulation-based model for a selected range of at least one of inputs or outputs, wherein the inputs to the transformed model include the input mask design, wherein the outputs of the transformed model include one or more output parameters associated with fabrication of the input mask design as well as one or more sensitivity metrics describing sensitivities of the one or more output parameters to variations of the input mask design, wherein the one or more output parameters include at least one of the layer thickness after the one or more process steps or a stochastic defect rate based on the layer thickness;
receiving a candidate mask design; and
generating a repaired mask design based on the transformed model and the candidate mask design.

22. The method of claim 21, further comprising:
a lithography sub-system configured to expose one or more samples with patterns based on the repaired mask design.

23. A system comprising:
a controller including one or more processors configured to execute program instructions causing the one or more processors to:
develop a simulation-based model of a layer thickness after one or more process steps for fabricating features on a sample, wherein inputs to the simulation-based model include a recipe defining an input mask design to be exposed on the sample and one or more process parameters associated with the one or more process steps, wherein outputs of the simulation-based model include at least the layer thickness after the one or more process steps;
develop a transformed model of the fabrication process that emulates the simulation-based model and has a faster evaluation speed than the simulation-based model for a selected range of at least one of inputs or outputs, wherein the inputs to the transformed model include the input mask design and at least one of the one or more process parameters, wherein the outputs of the transformed model include one or more output parameters associated with fabrication of the input mask design with the one or more process steps as well as one or more sensitivity metrics describing sensitivities of the one or more output parameters to the inputs to the transformed model, wherein the one or more output parameters include at least one of the layer thickness after the one or more process steps or a stochastic defect rate based on the layer thickness;
receive a candidate recipe including a candidate mask design and the at least one of the one or more process parameters; and
generate a repaired recipe based on the transformed model and the candidate mask design.

24. The system of claim 23, wherein the layer thickness comprises:
at least one of a thickness of a photoresist layer after a lithography process step or a thickness of a process layer after an etching step.

25. The system of claim 23, wherein the at least one of the simulation-based model or the transformed model provides at least one of the layer thickness or a probability of the layer thickness in a presence of process variations.

26. The system of claim 23, wherein the candidate mask design and the repaired mask design are represented by at least one of a binary representation, a polygon representation, a distance-field representation, or a level-set representation.

27. The system of claim 23, wherein generate the repaired recipe based on the transformed model and the candidate mask design comprises:
generate updates to the candidate recipe including at least one of update vectors for the candidate mask design or updates to the at least one of the one or more process parameters; and
update the candidate recipe with the updates to generate the repaired recipe.

28. The system of claim 23, wherein generate the repaired mask design based on the transformed model and the candidate mask design comprises:
train a machine learning model with training data generated by the transformed model; and
generate the repaired recipe with the machine learning model.

29. The system of claim 23, wherein the one or more output parameters comprise:
the layer thickness, the stochastic defect rate based on the layer thickness, and an edge placement error.

30. The system of claim 23, wherein the one or more output parameters comprise:
the stochastic defect rate based on the layer thickness.

31. The system of claim 23, wherein the one or more output parameters comprise:

the stochastic defect rate based on the layer thickness and an edge placement error.

* * * * *